(12) United States Patent
Ishikawa et al.

(10) Patent No.: US 12,080,869 B2
(45) Date of Patent: Sep. 3, 2024

(54) WEB EDGE METROLOGY

(71) Applicant: Applied Materials, Inc., Santa Clara, CA (US)

(72) Inventors: David Masayuki Ishikawa, Mountain View, CA (US); Girish Kumar Gopalakrishnan Nair, San Jose, CA (US); Ezhiylmurugan Rangasamy, San Jose, CA (US); David Alvarez, San Jose, CA (US); Kent Qiujing Zhao, San Francisco, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 123 days.

(21) Appl. No.: 17/543,360

(22) Filed: Dec. 6, 2021

(65) Prior Publication Data

US 2022/0190306 A1   Jun. 16, 2022

Related U.S. Application Data

(60) Provisional application No. 63/123,878, filed on Dec. 10, 2020.

(51) Int. Cl.
*H01M 4/04* (2006.01)
*G01B 7/06* (2006.01)
(Continued)

(52) U.S. Cl.
CPC .......... *H01M 4/0404* (2013.01); *G01B 7/105* (2013.01); *G01B 11/303* (2013.01);
(Continued)

(58) Field of Classification Search
CPC .... H01M 4/0404; C23C 14/54; C23C 14/545; C23C 14/547; C23C 14/562;
(Continued)

(56) References Cited

U.S. PATENT DOCUMENTS 5,077,464 A   12/1991   Ebbing et al.
5,832,359 A   11/1998   Acquaviva
(Continued)

FOREIGN PATENT DOCUMENTS

EP    3674354 A1      7/2020
WO    2019/057272  *  3/2019
WO    2019246095 A1  12/2019

OTHER PUBLICATIONS

International Search Report and Written Opinion dated Apr. 11, 2022 for Application No. PCT/US2021/062013.
(Continued)

*Primary Examiner* — Tabassom Tadayyon Eslami
(74) *Attorney, Agent, or Firm* — Patterson + Sheridan, LLP

(57) ABSTRACT

Metrology systems and processing methods for continuous lithium ion battery (LIB) anode pre-lithiation and solid metal anode protection are provided. In some embodiments, the metrology system integrates at least one complementary non-contact sensor to measure at least one of surface composition, coating thickness, and nanoscale roughness. The metrology system and processing methods can be used to address anode edge quality. The metrology system and methods can facilitate high quality and high yield closed loop anode pre-lithiation and anode protection layer deposition, alloy-type anode pre-lithiation stage control improves LIB coulombic efficiency, and anode coating with pinhole free and electrochemically active protection layers resist dendrite formation.

12 Claims, 10 Drawing Sheets

(51) Int. Cl.
  *G01B 11/30* (2006.01)
  *H01M 4/38* (2006.01)
  *H01M 4/66* (2006.01)
  *H01M 10/0525* (2010.01)
  *G01N 21/84* (2006.01)

(52) U.S. Cl.
  CPC ....... *H01M 4/0426* (2013.01); *H01M 4/0471* (2013.01); *H01M 4/382* (2013.01); *H01M 4/661* (2013.01); *H01M 10/0525* (2013.01); *G01N 2021/8438* (2013.01); *H01M 2220/20* (2013.01)

(58) Field of Classification Search
  CPC .......... C23C 14/14; G01B 7/06; G01B 7/085; G01B 7/105; B65G 31/04
  See application file for complete search history.

(56) References Cited

U.S. PATENT DOCUMENTS

| | | |
|---|---|---|
| 7,112,961 B2 | 9/2006 | Lei et al. |
| 7,679,739 B2 | 3/2010 | Hayashi et al. |
| 7,952,703 B2 | 5/2011 | Hayashi et al. |
| 7,969,568 B2 | 6/2011 | Holden et al. |
| 9,046,338 B2 | 6/2015 | Boccara et al. |
| 9,335,151 B2 | 5/2016 | Budiarto et al. |
| 9,880,233 B2 | 1/2018 | Ravid |
| 10,012,494 B2 | 7/2018 | David et al. |
| 10,281,261 B2 | 5/2019 | Paul et al. |
| 10,745,827 B2 | 8/2020 | Jin et al. |
| 10,944,103 B2 | 3/2021 | Gopalakrishnan Nair et al. |
| 11,774,235 B2 | 10/2023 | David et al. |
| 2007/0005595 A1 | 1/2007 | Gafter |
| 2010/0046794 A1 | 2/2010 | Hayashi et al. |
| 2010/0103411 A1* | 4/2010 | Holden ................. G01J 3/0294 702/179 |
| 2014/0368831 A1 | 12/2014 | Ser |
| 2016/0370173 A1* | 12/2016 | Paul .................. H01J 37/32935 |
| 2019/0140267 A1* | 5/2019 | Gopalakrishnan Nair ................... H01M 4/0404 |
| 2019/0246095 A1* | 8/2019 | Brevnov et al. |
| 2019/0345638 A1 | 11/2019 | Jin et al. |
| 2019/0390949 A1* | 12/2019 | Wu ....................... G01B 7/105 |
| 2020/0011652 A1 | 1/2020 | Johnston et al. |
| 2020/0360866 A1 | 11/2020 | Zhou et al. |
| 2021/0218032 A1 | 7/2021 | Brevnov |

OTHER PUBLICATIONS

Poller et al., "Non-Contact Roughness Measurement in Sub-Micron Range by Considering Depolarization Effects" Sensors 2019, 19, 2215; 12 pages.

* cited by examiner

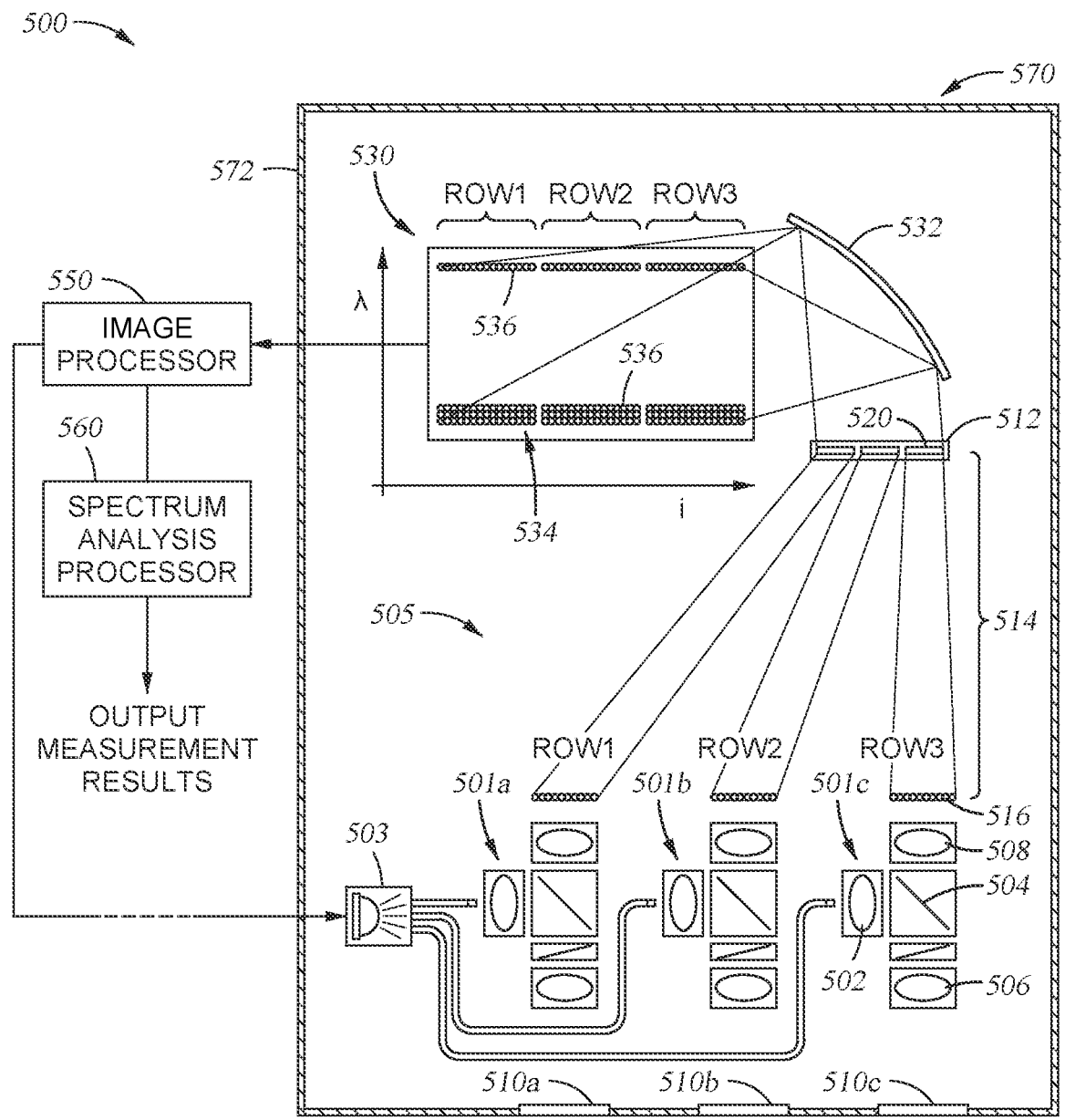
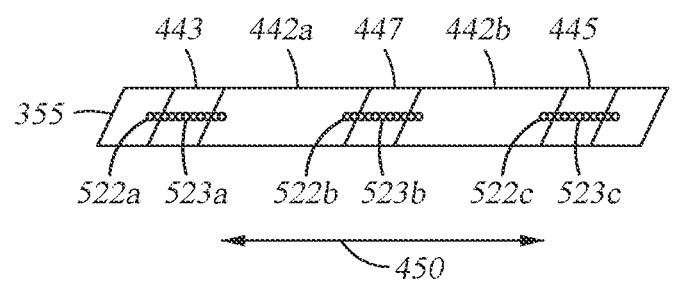
Fig. 5

WEB EDGE METROLOGY

CROSS-REFERENCE TO RELATED APPLICATIONS

This application claims benefit to U.S. Prov. Appl. No. 63/123,878, filed on Dec. 10, 2020, which is herein incorporated by reference.

BACKGROUND

Field

Embodiments described herein generally relate to vacuum deposition systems and methods for processing a flexible substrate. More specifically, embodiments described and discussed herein relate to roll-to-roll vacuum deposition systems and methods of monitoring and controlling material deposition.

Description of the Related Art

Rechargeable electrochemical storage systems are increasing in importance for many fields of everyday life. High-capacity energy storage devices, such as lithium-ion (Li-ion) batteries and capacitors, are used in a growing number of applications, including portable electronics, medical, transportation, grid-connected large energy storage, renewable energy storage, and uninterruptible power supply (UPS). In each of these applications, the charge/discharge time and capacity of energy storage devices are fundamental parameters. In addition, the size, weight, and/or cost of such energy storage devices are also fundamental parameters. Further, low internal resistance is integral for high performance. The lower the resistance, the less restriction the energy storage device encounters in delivering electrical energy. For example, in the case of a battery, internal resistance affects performance by reducing the total amount of useful energy stored by the battery as well as the ability of the battery to deliver high current.

An effective roll-to-roll deposition process not only provides a high deposition rate, but also provides a film surface, which lacks small-scale roughness, contains minimal defects, and is flat, for example, lacks large scale topography. In addition, an effective roll-to-roll deposition process also provides consistent deposition results or "repeatability." Depositing material on a web substrate with uncontrolled, misaligned or improperly positioned web material relative to the deposition source can adversely affect the process results and the internal resistance of the final battery.

Therefore, there is a need for an improved apparatus and methods for monitoring and controlling deposition of material in a roll-to-roll polishing system.

SUMMARY

Embodiments described herein generally relate to vacuum deposition systems and methods for processing a flexible substrate. More specifically, embodiments described and discussed herein relate to roll-to-roll vacuum deposition systems and methods of monitoring and controlling material deposition.

In one or more embodiments, a flexible substrate coating system is provided and includes a processing module which has a plurality of chambers arranged in sequence, each chamber configured to perform one or more processing operations to a continuous sheet of flexible material. The processing module further includes a coating drum capable of guiding the continuous sheet of flexible material past the plurality of chambers along a travel direction, wherein the chambers are radially disposed about the coating drum. The processing module further includes a metrology module. The metrology module includes a plurality of non-contact sensors positioned side-by-side along a transverse direction, wherein the transverse direction is perpendicular to the travel direction.

In other embodiments, the plurality of non-contact sensors include a spectrographic sensor assembly operable to capture spectrographic images of coated and uncoated portions of the continuous sheet of flexible material. The spectrographic sensor includes a strobe light source and an imager. The imager is a charge couple device (CCD) array. The plurality of non-contact sensors includes a first eddy current sensor operable to measure a thickness of a coated portion of the continuous sheet of flexible material and a second eddy current sensor operable to measure a thickness of an uncoated portion of the continuous sheet of flexible material. The coating system further includes an optical profilometer operable to measure web flutter of the continuous sheet of flexible material. The plurality of non-contact sensors include a web roughness sensor operable to measure surface roughness of a coated portion of the continuous sheet of flexible material and an uncoated portion of the continuous sheet of flexible material. The web roughness sensor includes an argon laser and a CMOS camera. The coating system further includes an unwinding module housing a feed reel capable of providing the continuous sheet of flexible material and a winding module housing a take-up reel capable of storing the continuous sheet of flexible material. The continuous sheet of flexible material includes a copper substrate having a lithium metal layer formed on the copper substrate. The continuous sheet of flexible material includes a copper substrate having a lithiated anode film formed on the copper substrate. The anode film is selected from a graphite anode film, a silicon-graphite anode film, or a silicon film. The plurality of chambers includes at least one of a sputtering source, a thermal evaporation source, and an electron beam source.

In some embodiments, the method includes transferring a continuous sheet of flexible material from a feed reel in an unwinding chamber to a deposition module arranged downstream from the unwinding chamber, the deposition module including a first coating drum capable of guiding the continuous sheet of flexible material past a plurality of deposition units. The method further includes guiding the continuous sheet of flexible material past the plurality of deposition units along a travel direction while depositing a lithium metal film on the flexible substrate via the first plurality of deposition units, wherein the chambers are radially disposed about the coating drum. The method further includes guiding the continuous sheet of flexible material past a metrology module, including a plurality of non-contact optical sensors positioned side-by-side along a transverse direction, wherein the optical sensors have a field of view coinciding with the travel path traversed by the continuous sheet of flexible material and the transverse direction is perpendicular to the travel direction. The method further includes flashing a strobe lamp in the field of view while guiding the continuous sheet of flexible material past the field of view. The method further includes obtaining a still image of the continuous sheet of flexible material in the field of view. The method further includes channeling the light reflected from respective image elements of the image through respective light channeling elements to respective locations of a spectrographic light dispenser. The method further includes recording a spectral distribution at each image element within the field of view.

In one or more embodiments, the method further includes searching for distributions that are similar to one another and grouping the distributions into groups of mutually similar distributions. The method further includes classifying the groups by the number of distributions contained in each group. The method further includes selecting at least one of the largest groups and combining the distributions of that group together and providing the combined distribution as the spectral distribution of one region of the continuous sheet of flexible material. The method further includes processing the combined distribution in accordance with a spectrum analysis process. The continuous sheet of flexible material includes a copper substrate and the lithium metal film is formed on the copper substrate. The continuous sheet of flexible material includes a copper substrate having an anode film formed on the copper substrate and the lithium metal film is formed on the anode film. The anode film is selected from a graphite anode film, a silicon-graphite anode film, or a silicon film.

In other embodiments, the method includes transferring a continuous sheet of flexible material from a feed reel in an unwinding chamber to a deposition module arranged downstream from the unwinding chamber, the deposition module including a first coating drum capable of guiding the continuous sheet of flexible material past a plurality of deposition units. The method further includes guiding the continuous sheet of flexible material past the plurality of deposition units along a travel direction while depositing a lithium metal film on the flexible substrate via the first plurality of deposition units, wherein the chambers are radially disposed about the coating drum. The method further includes guiding the continuous sheet of flexible material past a metrology module, the metrology module includes a plurality of non-contact optical sensors positioned side-by-side along a transverse direction. The optical sensors have a field of view coinciding with the travel path traversed by the continuous sheet of flexible material and the transverse direction is perpendicular to the travel direction. The method further includes obtaining a first contactless electrical resistivity measurement of the lithium metal film on the continuous sheet of flexible material in the field of view. The method further includes determining a first thickness of the lithium metal film using the first contactless electrical resistivity measurement.

Embodiments can include one or more of the following potential advantages. Determining the first thickness of the lithium metal film includes comparing the first contactless electrical resistivity measurement with a previously determined correlation between electrical resistivity measurements and respective thickness of lithium metal films. The method further includes obtaining a contactless laser interferometry measurement of the continuous sheet of flexible material in the field of view. The method further includes determining web flutter of the continuous sheet of flexible material based on the contactless laser interferometry measurement of the continuous sheet of flexible material. The method further includes adjusting the first thickness measurement of the lithium metal film based on the web flutter to determine a corrected first thickness of the lithium metal film. The method further includes aging the lithium metal film for a period of time. The method further includes obtaining a second contactless electrical resistivity measurement of the lithium metal film on the continuous sheet of flexible material in the field of view after aging the lithium metal film for the period of time. The method further includes determining a second thickness of the lithium metal film using the second contactless electrical resistivity measurement. Determining the second thickness of the lithium metal film includes comparing the second contactless electrical resistivity measurement with a previously determined correlation between electrical resistivity measurements and respective thickness of lithium metal films. The method further includes determining a pre-lithiation amount of an anode film deposited on the continuous sheet of flexible material by comparing the first thickness of the lithium metal film with the second thickness of the lithium metal film. The continuous sheet of flexible material includes a copper substrate and the lithium metal film is formed on the copper substrate. The continuous sheet of flexible material includes a copper substrate having an anode film formed on the copper substrate and the lithium metal film is formed on the anode film. The anode film is selected from a graphite anode film, a silicon-graphite anode film, or a silicon film.

In some embodiments, the method includes transferring a continuous sheet of flexible material from a feed reel in an unwinding chamber to a deposition module arranged downstream from the unwinding chamber, the deposition module comprising a first coating drum capable of guiding the continuous sheet of flexible material past a plurality of deposition units. The method further includes guiding the continuous sheet of flexible material past the plurality of deposition units along a travel direction while depositing a lithium metal film on the flexible substrate via the first plurality of deposition units, wherein the chambers are radially disposed about the coating drum. The method further includes guiding the continuous sheet of flexible material past a metrology module, including a plurality of non-contact optical sensors positioned side-by-side along a transverse direction, wherein the optical sensors have a field of view coinciding with the travel path traversed by the continuous sheet of flexible material, and the transverse direction is perpendicular to the travel direction. The method further includes projecting three or more fringe patterns of polarized structured light onto the continuous sheet of flexible material in the field of view. The method further includes recording an intensity at each image element within the field of view for each fringe shift. The method further includes determining a measurement of coating roughness from the image element intensity distribution.

In other embodiments, a non-transitory computer readable medium has stored thereon instructions, which, when executed by a processor, causes the process to perform operations of the above apparatus and/or method.

BRIEF DESCRIPTION OF THE DRAWINGS

So that the manner in which the above-recited features of the present disclosure can be understood in detail, a more particular description of the embodiments, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 5 illustrates a spectrographic metrology system according to one or more embodiments described and discussed herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
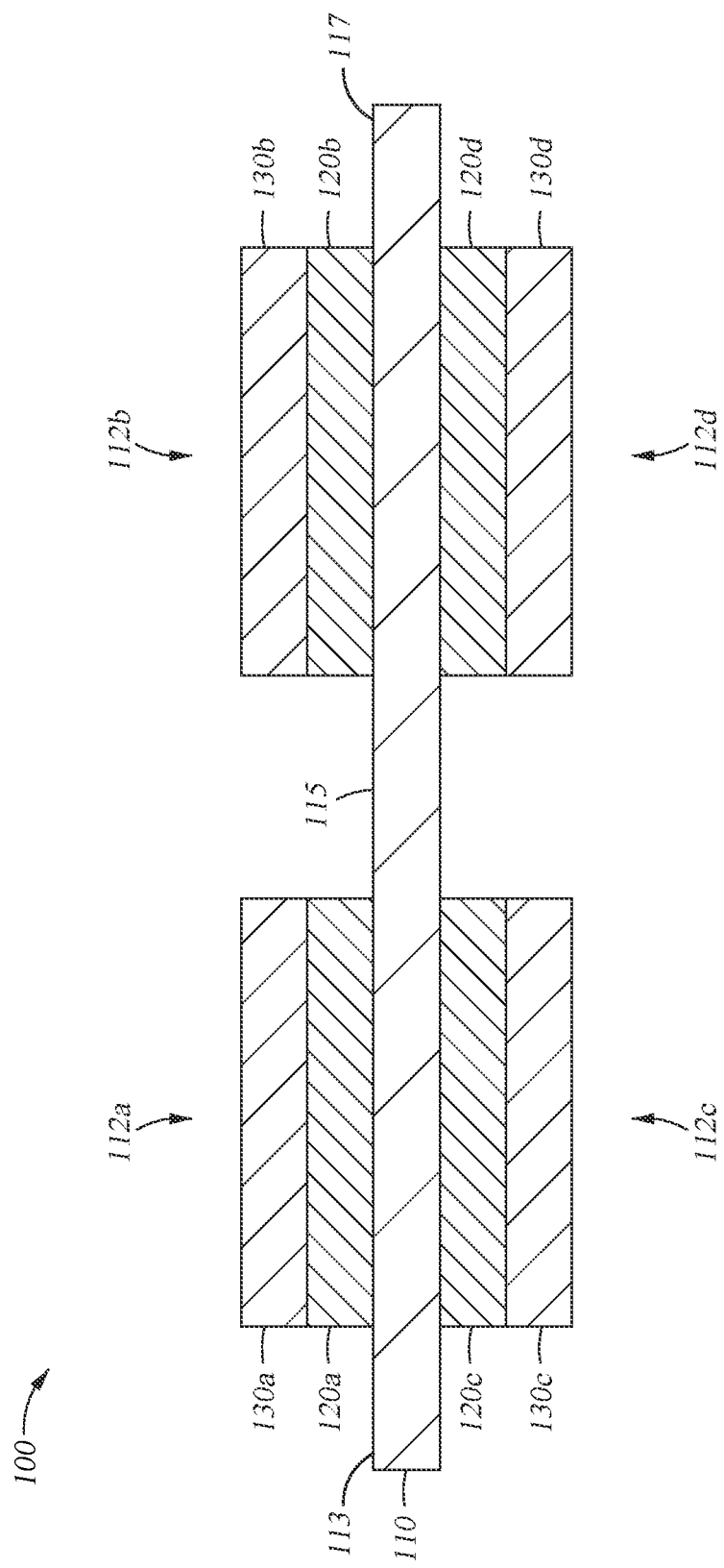
FIG. 1 illustrates a schematic cross-sectional view of one example of a flexible layer stack formed according to one or more embodiments described herein.

The following disclosure describes roll-to-roll vacuum deposition systems, metrology systems, and methods of forming at least two layers on a flexible substrate. Certain details are set forth in the following description and in FIGS. 1-10 to provide a thorough understanding of various embodiments of the disclosure. Other details describing well-known structures and systems often associated with web coating, coating metrology systems, electrochemical cells, and secondary batteries are not set forth in the following disclosure to avoid unnecessarily obscuring the description of the various embodiments.

Many of the details, dimensions, angles and other features shown in the Figures are merely illustrative of particular embodiments. Accordingly, other embodiments can have other details, components, dimensions, angles and features without departing from the spirit or scope of the present disclosure. In addition, further embodiments of the disclosure can be practiced without several of the details described below.

Energy storage devices, for example, batteries, typically include a positive electrode, an anode electrode separated by a porous separator, and an electrolyte, which is used as an ion-conductive matrix. Graphite anodes are the current state of the art, but the industry is moving from the graphite based anode to silicon blended graphite anodes to increase cell energy density. However, silicon blended graphite anodes often suffer from irreversible capacity loss that occurs during the first cycle. Thus, there is a need for methods for replenishing this first cycle capacity loss. In addition, lithium metal anodes are also contemplated. However, lithium metal anodes present numerous safety issues.

Vacuum web coating for anode pre-lithiation and solid metal anode protection involves thick (three to twenty micron) metallic lithium deposition on double-side-coated and calendered alloy-type graphite anodes and current collectors, for example, six micron or thicker copper foil, nickel foil, or metallized plastic web. Pre-lithiation and solid metal anode web coating further involves thin, for example, less than 1-micron protection layer coatings. In the absence of protection layer coatings, the metallic lithium (via thermal evaporation or rolled foils) surface is susceptible to adverse corrosion and oxidation.

In some embodiments, a metrology system and processing methods for continuous lithium ion battery ("LIB") electric vehicle ("EV") anode pre-lithiation and consumer electric ("CE") solid metal anode protection are provided. In some embodiments, the metrology system integrates at least one complementary non-contact sensor to measure at least one of surface composition, coating thickness, and nanoscale roughness. The metrology system and processing methods can be used to address anode edge quality. The metrology system and methods can facilitate high quality and high yield closed loop anode pre-lithiation and anode protection layer deposition; EV alloy-type anode pre-lithiation stage control improves LIB coulombic efficiency; CE anode coating with pinhole free and electrochemically active protection layers resist dendrite formation.

Web coating for EV anode pre-lithiation and CE solid metal anode protection typically involves thick, for example, three to twenty micron, metallic lithium deposition on double-side-coated and calendered alloy-type graphite anodes and current collectors, for example, six micron or thicker copper foil, nickel foil, or metallized plastic web. EV and CE anode web coating further typically involves thin (<1 micron) protection layer coating.

Thin protection layers coated on reactive metallic lithium coatings are difficult to characterize using conventional radio isotopic web metrology, which typically relies on basis density change and is therefore relatively insensitive to thin lithium films. For example, Krypton-85 radio isotopic source sensitivity is optimal above 25 $g/m^2$ gain; however, a twenty micron thick lithium coating results in only 11 $g/m^2$ gain. Further, metallic lithium and protection layer web coatings are difficult to characterize using conventional thin film quartz crystal microbalance (QMB), laser triangulation, for example, Keyence and Micro-Epsilon LVDT interferometers, and capacitance, for example, Eddy Current Sensors (ECS). In addition, conventional thin film sensors provide global reference values only; readings cannot be used to assess local (web edge) film composition, such as surface contamination, and are prone to noise due to unavoidable web flutter, which is typically caused by the winding vibration of the web.

Local film composition at the anode edge near the cathode overhang is a factor, which influences cell performance. For prismatic and jelly-roll cells, the anode is typically larger than the cathode by approximately 0.5 millimeters on all sides or approximately 0.1 millimeters along the top and bottom. Further, excess metallic lithium (via thermally evaporated metallic lithium intended for pre-lithiation) within this "overhang" area, along the anode edge(s), can pose significant safety hazards and can adversely compromise cell performance.

Providing an overhang (as small as 0.1 millimeter wide) in addition to formulating an anode with ten to fifteen percent higher electrochemical capacity is to avoid the risk of lithium ions migrating from the cathode to the anode, during cell charging and plating along the current collector edges. Thus, lithium-ion battery manufacturing typically involves precise process control over the amount of metallic lithium and ultimately pre-lithiation stage control as anode coatings approach 0.5 to 0.1 millimeter of the overhang edges.

One consequence of the need for precise metallic lithium coating in advance of intercalation near the anode overhang area is that protection layers are subject to a similarly high level of attention to edge quality. If, for example, an electrochemically insulating protection layer material, such as lithium carbonate, is surface-converted on the as-deposited metallic lithium to minimize metallic lithium air reactivity during cell assembly then it is important to verify that the carbonate protection layer is not too thick. If the surface-converted lithium carbonate is too thick, dead lithium, for example, lithium compounds, rather than metallic lithium near the overhang may be present. Dead lithium is undesirable along the anode edges because it can introduce dendrite hazards, which defeat the techno-economic incentives for anode pre-lithiation.

If an electrochemically active protection layer material, for example, lithium fluoride is coated on the as-deposited metallic lithium, to minimize contact resistance and improve electrolyte wetting—in addition to minimizing metallic lithium air reactivity during cell assembly—then it is important to verify that the lithium fluoride protection layer is not too rough. If the protection layer is too rough, then pinholes, underlying metallic lithium surface contamination and other undesirable defects may be present near the overhang.

The need therefore exists for a metrology system that is capable of precisely measuring metallic lithium and protection layer composition, thickness nonuniformity, and roughness. In the absence of the web edge metrology systems described herein, undesirable trial and error at high expense is required to optimize anode edge quality. In addition, a toll coating business strategy based on coating high mix anode designs would not be feasible given the need for costly destructive SEM cross section analysis and the inability to segregate high quality coated lengths from "reworkable" lengths on each roll.

Some embodiments described and discussed herein improve on conventional roll-to-roll ("R2R") metrology. As described above, radio isotopic and other sensors have limited utility to alkali metal patterned web characterization. That said, aspects of some conventional sensors are useful but for the need to overcome specific limitations.

One such class of sensors are linear variable differential transformers (LVDT) sensors. LVDT sensors triangulate the time of flight between a laser source, surface, and receiver and then correlate the time of flight to calibrated coating thickness. In battery coating applications, coating thickness and uniformity are typically modulated in response to the calculated difference between real time web recipe set point and LVDT thickness measurement.

Unfortunately, LVDT deposition thickness control alone is inadequate for anode pre-lithiation because LVDT sensors are unsuitable for nanoscale roughness due to low resolution and for detecting the presence of nanoscale thick protection layers or surface contamination. LVDT sensors are further unsuitable for anode pre-lithiation because metallic lithium coatings deposited on silicon anodes are known to become thinner as the metallic lithium coating intercalates into silicon and graphite; LVDT sensors alone thus are insufficient to characterize pre-lithiation coatings.

Further, for metallic lithium layer thickness only, LVDT deposition thickness control is hindered by measurement noise due to intrinsic web flutter. Measurement noise can be compensated numerically, but again, the high value problem is edge characterization in the anode overhang vicinity, which is typically smaller, for example, less than 0.5 millimeters, than the spot size of many LVDT sensors.

Some embodiments described and discussed herein provide web edge characterization near the 0.5-millimeter overhang at the anode edge using inventive optical and capacitance-based metrology systems that also benefit from LVDT numerically compensated thickness measurement.

Embodiments described and discussed herein can include one or more of the following advantages. Metallic lithium can be distinguished from lithium compounds including protection layers versus contamination. Color changes are observable after metallic lithium and protection layer coatings are applied to pre-lithiated anodes and lithium metal anodes. These color changes, which are observable by the human eye, were recognized by the inventors as an opportunity to use broad spectrum, for example, strobe lamps and narrow band, for example, laser light sources to further facilitate precise non-contact optical-based characterization.

Some cell designs, such as fast charge EV LIB's, require more silicon and therefore more lithium than other cell designs. That said, excess metallic lithium coating and over-protection near the web edge presents safety hazards and obviates the techno-economic advantages of anode pre-lithiation.

Embodiments described and discussed herein can further include one or more of the following advantages. It can be verified that excess metallic lithium and dead lithium are not present along the anode edge and EV anode overhang. Further, coating defects, for example, insufficient metallic lithium thickness or insufficient protection layer thickness can be detected, and the web can be reworked in a second pass through the web coater to minimize scrap. In addition, the embodiments disclosed herein can be adapted for blanket coating characterization in the center of the web or elsewhere in the transverse and machine directions. For example, spectrographic analysis can be used to detect lithium "splashes" on the anode if the spectrographic module is adjusted to view the full transverse width of the web, for example, the same number of CMOS pixels, but at millimeter scale per pixel. Although splashes typically cannot be reworked, splashes and other defects can be mapped such that the greater remainder of the web can be manually salvaged, which may be acceptable for some applications.

For CE LIB's, some cell designs for cost insensitive CE applications employ high purity and exotic materials that are unsuitable for EV applications. Protection layers for CE anodes can be deposited using reactive chemistries, for example, pyrophoric and toxic precursors, in order to produce functional protection layers (sometimes multilayered) that are more sophisticated than minimizing air reactivity alone. For these next generation protection layers in development, the advantages of the optical elements of described and discussed herein are the ability to discern surface composition and nanoscale roughness near the web edge (and CE anode overhang).

For both EV and CE LIB's, as previously mentioned, color change is observable in lithium "sandwiched" between a combination of substrates and coatings. In some embodiments, the optical elements of the metrology system are designed to detect these subtle color changes. The inventors believe that the observable color changes (including various shades of grey and white) are important indicators of web, process and coater health. For example, the observable color changes can aid in anode development and manufacturing by quantifying visible film transformations that occur after coating and sometimes hours to days to weeks later, just before cell assembly and ageing.

In some embodiments, a metrology system and processing methods for continuous lithium ion battery ("LIB")

anode pre-lithiation and solid metal anode protection are provided. The metrology system includes various modules and methods.

In some embodiments, the metrology system includes a spectrographic metrology system for spectrographic (real-time) analysis of as-deposited metallic lithium roughness, surface contamination, and/or protection layer quality. The spectrographic metrology system can include one or more broad-spectrum light sources. The broad spectrum light sources are used for areal (e.g., circular >Ø25 mm or rectangular >25 mm wide) specular and spectral analysis. The specular and spectral analysis can be focused along the web edge. The broad-spectrum light source can be constant or strobed, for example, if the anode has start-stop intermittent coating.

The spectrographic metrology system can further include one or more image sensors. The one or more image sensors can be focused on the LIB anode within the area illuminated by the broad-spectrum light source to detect reflected light emission.

The spectrographic metrology system can further include an image sensor signal processor. The image sensor signal processor converts specular intensity to a calibrated reflectance value. For example, high reflectance can indicate a "mirror-like" metallic lithium finish and low reflectance can indicate a "dull" metallic lithium finish. The "mirror-like" metallic lithium finish can be characteristic of desirable high metallic lithium purity present where undesirable surface contamination above metallic lithium is absent. Lower surface roughness can be characteristic of desirable high metallic lithium deposition quality present where small lithium ion cluster condensation and undesirable "splashes" or "remelting" of lithium are absent. The image sensor element can also be used to detect edge dimension wander, such as, for example average straightness. The image sensor signal processing can be used to convert spectral emission signature to a calibrated protection layer composition. Deviation in the wavelength(s) of the reflected light outside of a material-specific established spectral process control limit indicates an adverse protection layer process deviation. Metrology system feedback to a controller can be used to adjust deposition parameters. For example, if a low reflectance value is detected, the controller records a contamination fault. The contamination fault can be due to a vacuum air leak, anode outgassing, or any other oxygen, hydrogen, or nitrogen ("O—H—N") source. The metrology system feedback allows the operator to stop or modify the metallic lithium deposition process to minimize waste. If the spectral peaks have different intensity, for example, the intensity peaks are below a minimum threshold, or occur at different wavelengths, for example, the peaks "shift" below minimum or above maximum wavelength threshold limits, and the controller records a protection layer fault. The protection layer fault can be due to depletion of protection layer material source, for example, the gas or solid source being depleted, deposition on contaminated metallic lithium, deposition on non-uniform (large lithium cluster) metallic lithium, or any other protection layer deposition process window deviation. Metrology system feedback allows the operator to adjust or terminate the protection layer deposition process to minimize scrap. The spectrographic metrology described herein can be used to monitor the mirror finish and compounding spectrographic color changes. Further, material specific wave libraries on which process adjustments or termination decision to make can be developed.

In some embodiments, the metrology system includes an eddy current sensor (ECS) based metrology system for monitoring as-deposited coating thickness and protection layer application. The metrology system can further include a displacement sensor. The metrology system can include a sensor arrangement including at least one pair of eddy current sensors and a displacement sensor. The displacement sensor can be a linear variable differential transformer (LVDT) profilometer thickness sensor. The sensor arrangement can be positioned in the coating system to monitor as-deposited metallic lithium and protection layer coating to determine metallic lithium thickness gain. A signal from the ECS positioned over an uncoated portion of the web, for example, bare copper, is offset or subtracted from the ECS signal of the capacitance sensor positioned over the coated anode portion of the web. In this way, capacitance of the anode coating alone (without the copper foil) is considered. The signal can be further corrected for web flutter using the lift-off distance measured by the LVDT profilometer. As-deposited metallic lithium reservoir micron-scale thickness can be measured in the transverse web direction by positioning sensors across the width of the web. Any suitable number of sensors can be used depending upon the desired measurement. For example, for each deposition source, one set each of the eddy current sensor and the LVDT thickness sensor can be positioned before and after the deposition sources to provide metallic lithium thickness gain measurements in the transverse web direction. In one example, where three deposition sources are present, one set each of the eddy current sensor and the LVDT thickness sensor can be positioned before and after the deposition sources for a total of six sensors, which provide three metallic lithium thickness gain measurements in the transverse web direction.

The as-deposited metallic lithium reservoir thickness micron-scale depletion can be measured in the transverse web direction, after pre-lithiation at a predetermined temperature in a favorable environment for lithium ion intercalation. Measuring the metallic lithium reservoir thickness micron-scale depletion helps determine when to deposit subsequent protection layers. One advantage of applying the protection layer before or after pre-lithiation conditioning and reservoir thickness micron-scale depletion is that the likelihood of producing dead lithium is minimized. Due to the slow process of metallic lithium intercalation into the anode, application of the protection layer prior to metallic lithium intercalation can trap metallic lithium on the surface. Thus, it is preferable to apply the protection layer after the metallic lithium reservoir is controllably stabilized or intercalated into the anode.

In some embodiments, the metrology system includes polarized structured light (PSL) generators and image sensors. The PSL generators and image sensors can be configured for monitoring metallic lithium edge definition. The metrology system includes a sensor arrangement including PSL generators and image sensors. The sensor arrangement can be focused on one or more edges of the anode. The sensor arrangement can be positioned after the metallic lithium and protection layer coating sources. The PSL generators can project narrow bands of light onto the three-dimensional anode edge. Coatings near the three-dimensional anode edge typically have intrinsic nanoscale roughness, which causes the reflected polarized light to scatter and to depolarize. The scattered and depolarized light is recorded by the image sensor. Contrast between two reference waves and the emission from the anode is used to compute a roughness that is proportional to the polarized light source. In one example, the polarized light source can be a laser source, such as, a 488-nanometer laser source.

Near and far as-deposited metallic lithium geometry are recorded along the web length continuously or intermittently. Structured light can complement conventional laser profilometers by tightening the field of view to the edge (either inboard or outboard of the graphite step for pre-lithiated anodes and either inboard or outboard of the lithium-only step for lithium metal anodes). Examples of laser profilometers that can be used with the embodiments described herein include the Keyence LJ-X8020, which can measure anode edge definition within a 7.5 mm width and has edge thickness (Z-axis) and straightness (X-axis) repeatability within 0.3 μm for both axes, and the Keyence CL-PT010, which can measure anode edge definition within a 10 mm width and has edge thickness and straightness repeatability within 0.2 μm for both axes. Polarized structured light benefits from the drum runout compensated thickness measurement determined using conventional profilometers and tightens the field of view by providing nanoscale roughness inside or outside the coated region near the anode overhang.

For pre-lithiated anodes, if the metallic lithium is outboard the slurry-cast anode coating, the controller records a coating fault. Metallic lithium outboard the slurry-cast anode can be detected if the sensing spot is focused on the rolled annealed (RA) or electro deposited (ED) copper. For lithium metal anodes, if the metallic lithium is outboard a preferred coating boundary, the controller records a coating fault and can terminate processing. Since it can be challenging to rework or remove metallic lithium coating outboard the preferred coating footprint, the controller can record the coating fault to facilitate salvaging the portions of the web, which conform to the coating specification.

For pre-lithiated anodes and lithium metal anodes, if the metallic lithium quality inboard the preferred coating boundary is too thin and/or too rough, the controller can record a coating fault and adjust the coating recipe. For most PVD systems, edge definition is controlled using conventional (heated) temperature controlled mask liners. However, if the mask liners are too hot, direct radiation to the edge is above optimum, the metallic lithium coating can re-melt, and surface roughness increases while overall thickness decreases. Therefore, if the PSL and profilometers indicate high edge roughness or edge thinning, the temperature controlled mask can be actively fluid cooled or heater power modulated to proportionally reduce mask temperature.

For pre-lithiated anodes and lithium metal anodes, if the metallic lithium thickness is too thin and smooth, the controller can record a coating fault and attempt to adjust the coating recipe. For most PVD systems, coating thickness is determined by the vapor source temperature, web speed, and web gap pressure. If the web speed is too high or vapor source temperature too low, then the coating can be too thin. Therefore, if the PSL and profilometers indicate low edge roughness with edge thinning, the vapor power source can be increased and/or the web speed can be decreased.

It is noted that while the particular substrate on which some embodiments described herein can be practiced is not limited, it is particularly beneficial to practice the embodiments on flexible substrates, including for example, web-based substrates, panels and discrete sheets. The substrate can also be in the form of a foil, a film, or a thin plate.

It is also noted here that a flexible substrate or web as used within the embodiments described herein can typically be characterized in that it is bendable. The term "web" can be synonymously used to the term "strip" or the term "flexible substrate." For example, the web as described in embodiments herein can be a foil.

It is further noted that in some embodiments where the substrate is a vertically oriented substrate, the vertically oriented substrate can be angled relative to a vertical plane. For example, in some embodiments, the substrate can be angled from between about 1 degree to about 20 degrees from the vertical plane. In some embodiments where the substrate is a horizontally oriented substrate, the horizontally oriented substrate can be angled relative to a horizontal plane. For example, in some embodiments, the substrate can be angled from between about 1 degree to about 20 degrees from the horizontal plane. As used herein, the term "vertical" is defined as a major surface or deposition surface of the flexible conductive substrate being perpendicular relative to the horizon. As used herein, the term "horizontal" is defined as a major surface or deposition surface of the flexible conductive substrate being parallel relative to the horizon.

It is further noted that in the present disclosure, a "roll" or a "roller" can be understood as a device, which provides a surface, with which a substrate (or a part of a substrate) can be in contact during the presence of the substrate in the processing system. At least a part of the "roll" or "roller" as referred to herein can include a circular-like shape for contacting the substrate to be processed or already processed. In some embodiments, the "roll" or "roller" can have a cylindrical or substantially cylindrical shape. The substantially cylindrical shape can be formed about a straight longitudinal axis or can be formed about a bent longitudinal axis. According to some embodiments, the "roll" or "roller" as described herein can be adapted for being in contact with a flexible substrate. For example, a "roll" or "roller" as referred to herein can be a guiding roller adapted to guide a substrate while the substrate is processed (such as during a deposition process) or while the substrate is present in a processing system; a spreader roller adapted for providing a defined tension for the substrate to be coated; a deflecting roller for deflecting the substrate according to a defined travelling path; a processing roller for supporting the substrate during processing, such as a process drum, for example, a coating roller or a coating drum; an adjusting roller, a supply roll, a take-up roll or the like. The "roll" or "roller" as described herein can comprise a metal. In one or more embodiments, the surface of the roller device, which is to be in contact with the substrate, can be adapted for the respective substrate to be coated. Further, it is to be understood that according to some embodiments, the rollers as described herein can be mounted to low friction roller bearings, particularly with a dual bearing roller architecture. Accordingly, roller parallelism of the transportation arrangement as described herein can be achieved and a transverse substrate "wandering" during substrate transport can be eliminated.

FIG. 1 illustrates a schematic cross-sectional view of one example of a flexible layer stack 100 formed according to one or more embodiments described herein. The flexible layer stack 100 can be formed by a strip coating process. The flexible layer stack 100 can be formed using the metrology systems described herein. The flexible layer stack 100 can be a lithium metal anode structure. The flexible layer stack 100 shown in FIG. 1 includes a continuous flexible substrate 110 having a plurality of film stacks 112a-d (collectively 112) formed thereon. Each film stack 112a-d defines a strip, which is separated from the strip formed by an adjacent film stack 112a-d. For example, the first film stack 112a defines a first strip of deposited material, the second film stack 112b defines a second strip of deposited material, the third film stack 112c defines a third strip of material, and the fourth film stack 112d defines a fourth strip of material. The pattern of the film stacks 112a-d leaves an uncoated strip of the continuous flexible substrate 110 exposed along a near edge 113 of the continuous flexible substrate 110, an uncoated strip along a far edge 117 of the continuous flexible substrate 110, and an uncoated strip 115 defined between the first strip of deposited material 112a and the second strip of deposited material 112b.

Each film stack 112a-d includes a first layer 120a-d (collectively 120) and a second layer 130a-d. Although the flexible layer stack 100 is shown in FIG. 1 as having two layers on each side of the continuous flexible substrate 110, it will be understood by those of ordinary skill in the art that the flexible layer stack 100 can include a greater or smaller number of layers, which can be provided over, under and/or between the continuous flexible substrate 110, the first layer 120, and/or the second layer 130 shown in FIG. 1. Although shown as a double-sided structure, it will be understood by those of ordinary skill in the art that the flexible layer stack 100 can also be a single-sided structure with the continuous flexible substrate 110, the first layer 120, and the second layer 130.

According to some examples described herein, the continuous flexible substrate 110 can include a first material, and/or the first layer 120 can include a second material. Further, the second layer 130 can include a third material. For instance, the first material can be a conductive material, typically a metal, such as copper (Cu) or nickel (Ni). Furthermore, the continuous flexible substrate 110 can include one or more sub-layers. The second material can be a low melting temperature metal, for example, an alkali metal, such as lithium. The third material can be a protective film or interleaf film operable to protect the low melting temperature metal.

Generally, in prismatic cells, tabs are formed of the same material as the current collector and may be formed during fabrication of the stack, or added later. In some embodiments, as shown in FIG. 1, the current collector extends beyond the film stack and the portions of the current collector extending beyond the stack may be used as tabs. For example, any of the uncoated strips of the continuous flexible substrate 110 exposed along the near edge 113 of the continuous flexible substrate 110, the uncoated strip along the far edge 117 of the continuous flexible substrate 110, and the uncoated strip 115 defined between the first film stack 112a and the second film stack 112b can be used to form tabs.

According to some examples described herein, the continuous flexible substrate 110 can have a thickness equal to or less than about 25 µm, typically equal to or less than 20 µm, specifically equal to or less than 15 µm, and/or typically equal to or greater than 3 µm, specifically equal to or greater than 5 µm. The continuous flexible substrate 110 can be thick enough to provide the intended function and can be thin enough to be flexible. Specifically, the continuous flexible substrate 110 can be as thin as possible so that the continuous flexible substrate 110 can still provide its intended function.

According to some examples described herein, the first layer 120 can have a thickness of equal to or less than 10 µm, typically equal to or less than 8 µm, beneficially equal to or less than 7 µm, specifically equal to or less than 6 µm, in particular equal to or less than 5 µm. According to some examples, the thickness of the first layer 120 can be equal to or less than 4 µm, or equal to or less than 3 µm, or equal to or less than 2 µm.

According to some examples described herein, the second layer 130 can have a thickness of equal to or less than 10 µm, typically equal to or less than 8 µm, beneficially equal to or less than 7 µm, specifically equal to or less than 6 µm, in particular equal to or less than 5 µm. According to some example, the thickness of the second layer 130 can be equal to or less than 4 µm, or equal to or less than 3 µm, or equal to or less than 2 µm.

The flexible layer stack 100 shown in FIG. 1 can be, for example, a negative electrode of/for a secondary cell, such as a negative electrode or anode of/for a lithium battery. According to some examples described herein, a flexible negative electrode for a lithium battery includes the continuous flexible substrate 110 that can be a current collector including copper and having a thickness of equal to or less than 10 µm, typically equal to or less than 8 µm, beneficially equal to or less than 7 µm, specifically equal to or less than 6 µm, in particular equal to or less than 5 µm. The flexible negative electrode further includes a first layer 120 including lithium and having a thickness of equal to or more than 5 µm and/or equal to or less than 15 µm and a second layer 130 including a protective film having a thickness of equal to or more than 5 µm and/or equal to or less 15 µm.

Figure 2:
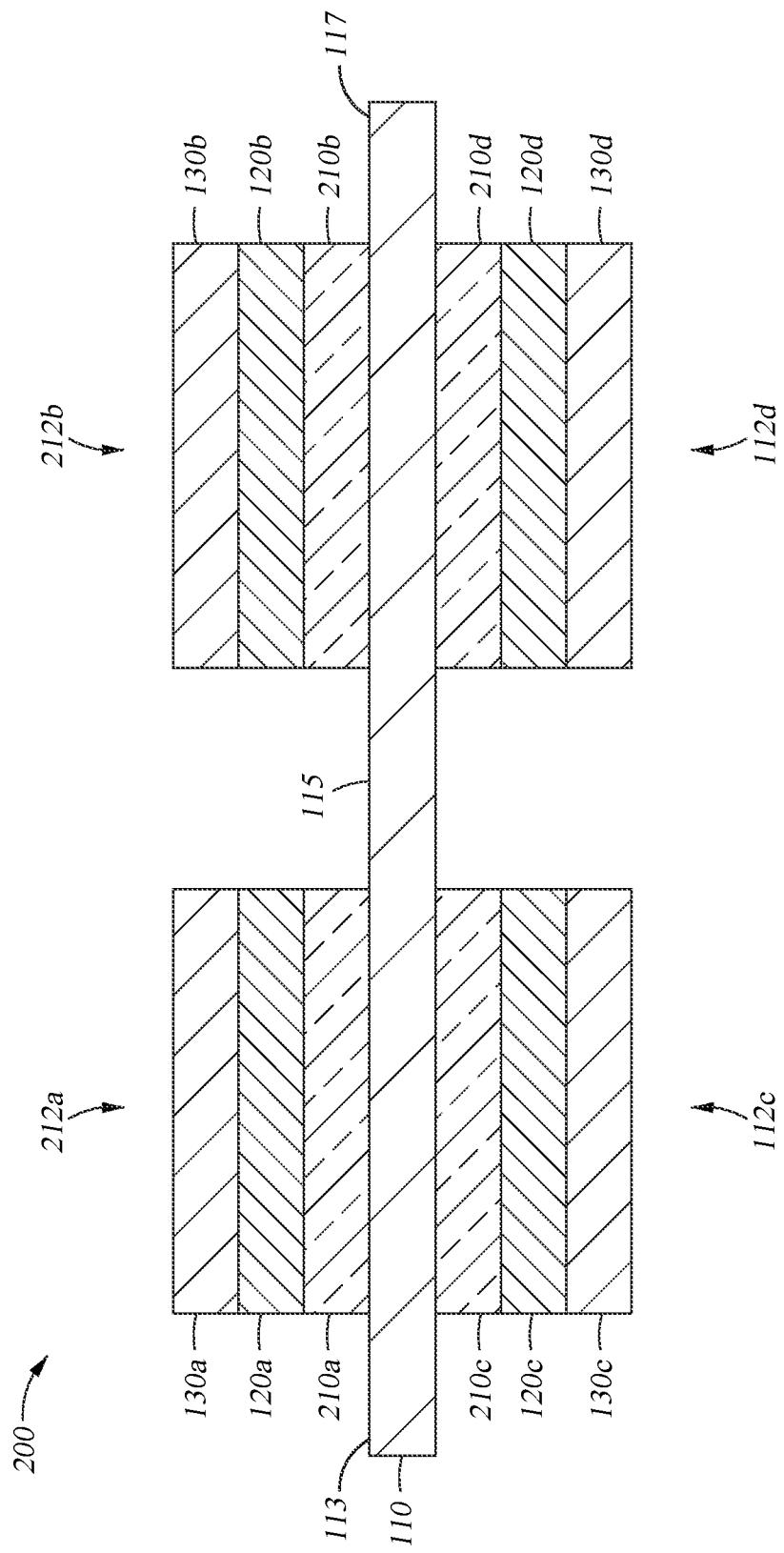
FIG. 2 illustrates a schematic cross-sectional view of another example of a flexible layer stack formed according to one or more embodiments described herein.

FIG. 2 illustrates a schematic cross-sectional view of another example of a flexible layer stack 200 formed according to one or more embodiments described herein. The flexible layer stack 200 is similar to the flexible layer stack 100 depicted in FIG. 1. The flexible layer stack 200 can be formed by a strip coating process. The flexible layer stack 200 can be formed using the metrology systems described herein. The flexible layer stack 200 can be a pre-lithiated anode structure. The flexible layer stack 200 shown in FIG. 2 includes a continuous flexible substrate 110 having a plurality of film stacks 212a-d (collectively 212) formed thereon. Each film stack 212a-d defines a strip, which is separated from a strip formed by an adjacent film stack 212a-d. Each film stack 212a-d further includes a third layer 210a-d (collectively 210) sandwiched in between the continuous flexible substrate 110 and the first layer 120. The third layer 210 can include a fourth material. The third layer 210 can have a thickness from about 10 µm to about 200 µm (e.g., from about 1 µm to about 100 µm; from about 10 µm to about 30 µm; from about 20 µm to about 30 µm; from about 1 µm to about 20 µm; or from about 50 µm to about 100 µm). The fourth material can include an anode material constructed from graphite, silicon, silicon-containing graphite, lithium metal, lithium metal foil or a lithium alloy foil (e.g., lithium aluminum alloys), or a mixture of a lithium metal and/or lithium alloy and materials such as carbon (e.g., coke, graphite), nickel, copper, tin, indium, silicon, oxides thereof, or a combination thereof. The fourth material can further include a binder material. For instance, the first material can be a conductive material, typically a metal, such as copper (Cu) or nickel (Ni). The fourth material can be graphite, silicon, or silicon-containing graphite. The second material can be a low melting temperature metal, for example, an alkali metal, such as lithium. The third material can be a protective film or interleaf film operable to protect the low melting temperature metal.

Figure 3:
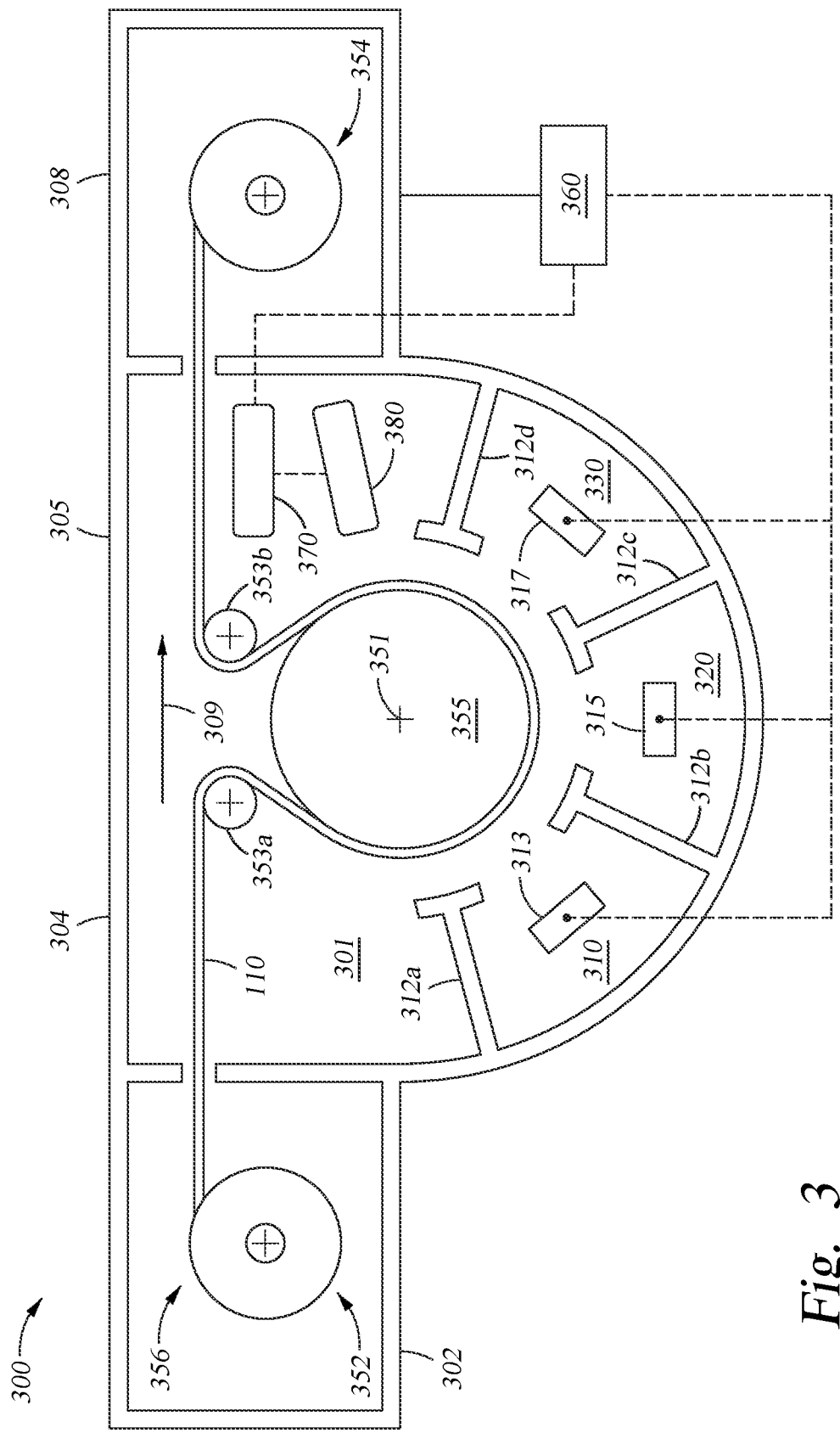
FIG. 3 illustrates a schematic side view of a vacuum processing system incorporating metrology according to one or more embodiments described and discussed herein.

FIG. 3 illustrates a schematic side view of a flexible substrate coating system 300 incorporating one or more metrology modules according to one or more embodiments described and discussed herein. The flexible substrate coating system 300 includes a first metrology module 370 and optionally a second metrology module 380. The first metrology module 370 can be at least one of a spectrographic metrology module, a capacitance-based metrology module, or a thickness metrology module. The second metrology module 380 can be at least one of a spectrographic metrology module, a capacitance-based metrology module, or a thickness metrology module. In one example, the first metrology module 370 is a thickness metrology module and the second metrology module 380 is a spectrographic metrology module. The thickness metrology module can be configured to measure a thickness of deposited material on a continuous flexible substrate. The spectrographic metrology module can be configured to measure at least one of surface roughness, surface contamination, and protection layer quality.

The flexible substrate coating system 300 can be a SMARTWEB® system, manufactured by Applied Materials, adapted for manufacturing lithium-containing anode film stacks according to the embodiments described herein. The flexible substrate coating system 300 can be used for manufacturing lithium-containing anodes, and particularly for film stacks for lithium-containing anodes, for example, the flexible layer stack 100 and the flexible layer stack 200. The flexible substrate coating system 300 includes a common processing environment 301 in which some or all of the processing actions for manufacturing lithium-containing anodes can be performed. In one example, the common processing environment 301 is operable as a vacuum environment. In another example, the common processing environment 301 is operable as an inert gas environment.

The flexible substrate coating system 300 is constituted as a roll-to-roll system including an unwinding module 302 for supplying a continuous flexible substrate, a processing module 304 for processing the continuous flexible substrate, and a winding module 308 for collecting the continuous flexible substrate. The processing module 304 includes a chamber body 305 that defines the common processing environment 301.

In some embodiments, the processing module 304 comprises a plurality of processing modules or sub-chambers 310, 320, 330 arranged in sequence, each configured to perform one processing operation to the continuous flexible substrate 110 or web of material. In one example, as depicted in FIG. 3, the sub-chambers 310, 320, 330 are radially disposed about a coating drum 355. In addition, arrangements other than radial are contemplated. For example, in another embodiment, the sub-chambers 310, 320, 330 can be positioned in a linear configuration. The sub-chambers 310, 320, 330 are separated by partition walls 312a-312d (collectively 312). For example, the first sub-chamber 310 is defined by partition walls 312a and 312b, the second sub-chamber 320 is defined by partition walls 312b and 312c, and the third sub-chamber 330 is defined by partition walls 312c and 312d. In one example, the sub-chambers 310, 320, 330 are closed with the exception of narrow, arcuate gaps, by partition walls 312. Although the sub-chambers 310, 320, 330 are each depicted as having a single deposition source, each sub-chamber 310-330 can be divided into two or more compartments each including a separate deposition source. The compartments can be closed or isolated relative to adjacent compartments except for a narrow opening allowing for deposition over the coating drum 355.

In some embodiments, the sub-chambers 310, 320, 330 are stand-alone modular sub-chambers wherein each modular processing chamber is structurally separated from the other modular sub-chambers. Therefore, each of the stand-alone modular sub-chambers, can be arranged, rearranged, replaced, or maintained independently without affecting each other. Although three sub-chambers 310, 320, 330 are shown, it should be understood that any number of sub-chambers could be included in the flexible substrate coating system 300.

The sub-chambers 310, 320, 330 can include any suitable structure, configuration, arrangement, and/or components that enable the flexible substrate coating system 300 to deposit a lithium-containing anode film stack according to embodiments described and discussed herein. For example, but not limited to, the sub-chambers may include suitable deposition systems including coating sources, power sources, individual pressure controls, deposition control systems, and temperature control. In some embodiments, the sub-chambers 310, 320, 330 are provided with individual gas supplies. As described herein, the sub-chambers 310, 320, 330 are typically separated from each other for providing good gas separation. Although three sub-chambers 310, 320, 330 are depicted, it should be understood that the processing module 304 could include any number of sub-chambers depending upon processing needs. For example, the flexible substrate coating system 300 can include, but is not limited to, 3, 6, or 12 sub-chambers.

Each of the sub-chambers 310, 320, 330 can include one or more deposition sources. For example, the first sub-chamber 310 includes a first deposition source 313, the second sub-chamber 320 includes a second deposition source 315, and the third sub-chamber 330 includes a third deposition source 317. Generally, the one or more deposition sources as described herein include an electron beam source and additional sources, which can be selected from the group of CVD sources, PECVD sources, and various PVD sources. Exemplary PVD sources include sputtering sources, electron beam evaporation sources, and thermal evaporation sources. In one or more embodiments, the evaporation source is a lithium (Li) source. Further, the evaporation source can also be an alloy of two or more metals. The material to be deposited (e.g., lithium) can be provided in a crucible. The lithium can be evaporated, for example, by thermal evaporation techniques or by electron beam evaporation techniques.

In one example, the first deposition source 313 is a sputtering source, the second deposition source 315 is an electron beam evaporation source, and the third deposition source 317 is a thermal evaporation source.

In some embodiments, the sub-chambers 310, 320, 330 are configured to process both sides of the continuous flexible substrate 110. Although the flexible substrate coating system 300 is configured to process the continuous flexible substrate 110, which is horizontally oriented, the flexible substrate coating system 300 can be configured to process substrates positioned in different orientations, for example, the continuous flexible substrate 110 can be vertically oriented. In some embodiments, the continuous flexible substrate 110 is a flexible conductive substrate. In some embodiments, the continuous flexible substrate 110 includes a conductive substrate with one or more layers formed thereon. In some embodiments, the conductive substrate is a copper substrate.

In some embodiments, the flexible substrate coating system 300 comprises a substrate transport arrangement 352. The substrate transport arrangement 352 can include any transfer mechanism capable of moving the continuous flexible substrate 110 past the sub-chambers 310, 320, 330. The substrate transport arrangement 352 can include a reel-to-reel system with a common take-up reel 354 positioned in the winding module 308, the coating drum 355 positioned in the processing module 304, and a feed reel 356 positioned in the unwinding module 302. The take-up reel 354, the coating drum 355, and the feed reel 356 may be individually heated. The take-up reel 354, the coating drum 355 and the feed reel 356 can be individually heated using an internal heat source positioned within each reel or an external heat source. The substrate transport arrangement 352 can further include one or more auxiliary transfer reels 353a, 353b positioned between the take-up reel 354, the coating drum 355, and the feed reel 356. According to one aspect, at least one of the one or more auxiliary transfer reels 353a, 353b, the take-up reel 354, the coating drum 355, and the feed reel 356 can be driven and rotated, by a motor.

In some embodiments, the first metrology module 370 is positioned downstream from the plurality of sub-chambers 310, 320, 330 and upstream from the take-up reel 354. In some embodiments, as depicted in FIG. 3, the first metrology module 370 is positioned in the processing module 304. Other locations for the first metrology module 370 are also contemplated. In one example, the first metrology module 370 can be positioned in the winding module 308. In another example, the first metrology module 370 is positioned in a separate module and the separate module is positioned between the processing module 304 and the winding module 308.

In some embodiments, the second metrology module 380 is positioned downstream from the plurality of sub-chambers 310, 320, 330 and upstream from the take-up reel 354. In some embodiments, as depicted in FIG. 3, the second metrology module 380 is positioned in the processing module 304. Other locations for the second metrology module 380 are also contemplated. In one example, the second metrology module 380 can be positioned in the winding module 308. In another example, the second metrology module 380 is positioned in a separate module and the separate module is positioned between the processing module 304 and the winding module 308.

The flexible substrate coating system 300 includes the feed reel 356 and the take-up reel 354 for moving the continuous flexible substrate 110 past the different sub-chambers 310, 320, 330. In operation, the continuous flexible substrate 110 is unwound from the feed reel 356 as indicated by the substrate travel direction shown by arrow 309. The continuous flexible substrate 110 can be guided via the one or more auxiliary transfer reels 353a, 353b. It is also possible that the continuous flexible substrate 110 is guided by one or more substrate guide control units (not shown) that shall control the proper run of the continuous flexible substrate 110, for instance, by fine adjusting the orientation of the continuous flexible substrate 110.

After uncoiling from the feed reel 356 and running over the auxiliary transfer reel 353a, the continuous flexible substrate 110 is then moved through the deposition areas provided at the coating drum 355 and corresponding to positions of the one or more deposition sources 313, 315, and 317. After traveling past the one or more deposition sources 313, 315, and 317, the processed continuous flexible substrate 110 then travels past the first metrology module 370 and the second metrology module 380 where the thickness and the quality of the deposited material can be determined.

During operation, the coating drum 355 rotates around axis 351 such that the flexible substrate moves in a travel direction represented by arrow 309.

The flexible substrate coating system 300 further includes a system controller 360 operable to control various aspects of the flexible substrate coating system 300. The system controller 360 facilitates the control and automation of the flexible substrate coating system 300 and can include a central processing unit (CPU), memory, and support circuits (or I/O). Software instructions and data can be coded and stored within the memory for instructing the CPU. The system controller 360 can communicate with one or more of the components of the flexible substrate coating system 300 via, for example, a system bus. A program (or computer instructions) readable by the system controller 360 determines which tasks are performable on a substrate. In some aspects, the program is software readable by the system controller 360, which can include code to control removal and replacement of the multi-segment ring. Although a single system controller, the system controller 360 is shown, it should be appreciated that multiple system controllers can be used with the aspects described herein.

Figure 4:
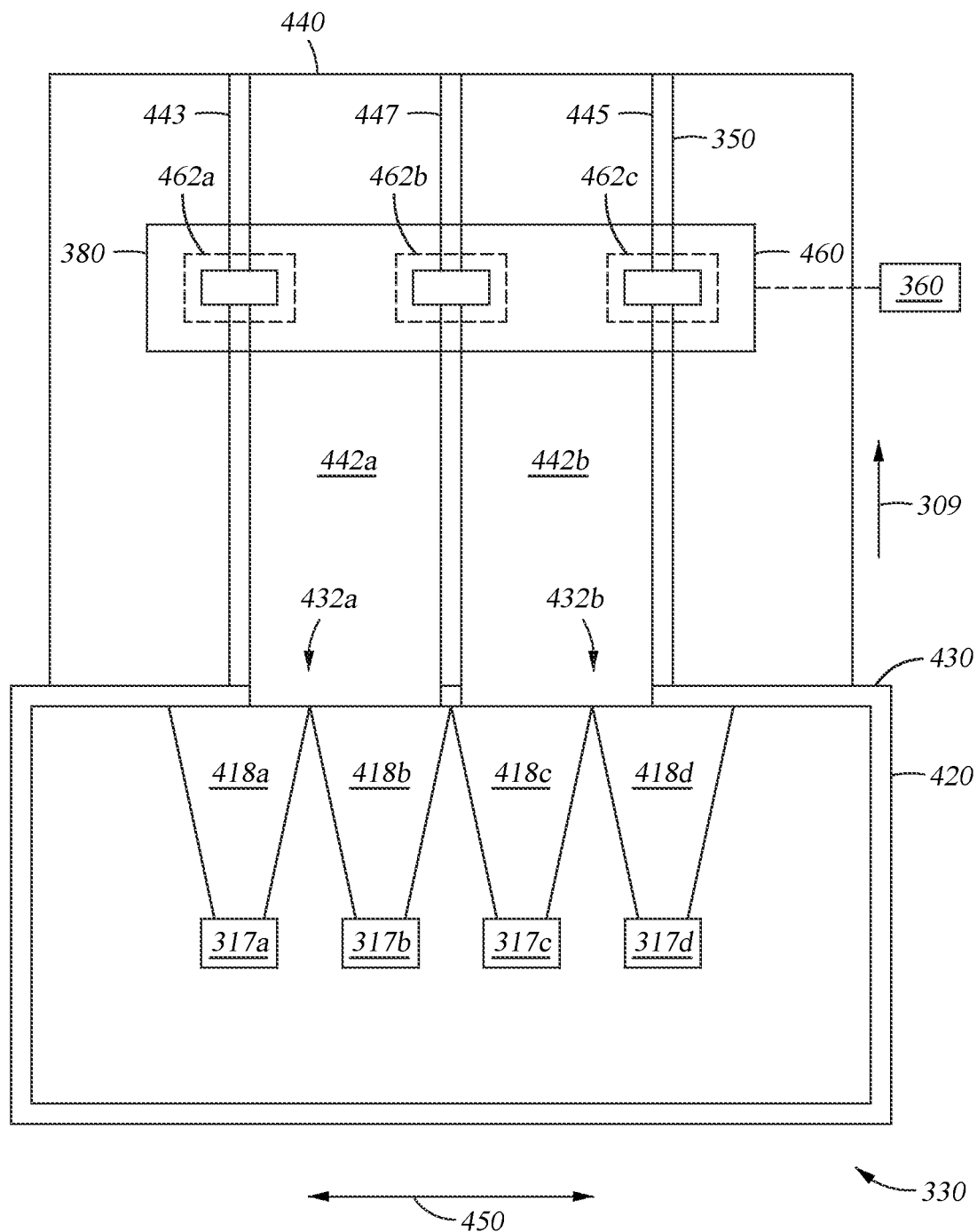
FIG. 4 illustrates a schematic view of a portion of the vacuum processing system of FIG. 3 according to one or more embodiments described and discussed herein.

FIG. 4 illustrates a perspective view of a portion of the flexible substrate coating system 300 of FIG. 3 incorporating the second metrology module 380 according to one or more embodiments described and discussed herein. The second metrology module 380 can be used in the flexible substrate coating system 300. The second metrology module 380 is depicted as being adjacent to the coating drum 355 of the flexible substrate coating system 300 having the continuous flexible substrate 110 disposed thereon and the third sub-chamber 330. Although depicted as part of the flexible substrate coating system 300, the second metrology module 380 can be used with other coating systems.

In some embodiments, the third sub-chamber 330 is defined by a sub-chamber body 420 with an edge shield 430 or mask positioned over the sub-chamber body 420. The third sub-chamber 330 includes a plurality of the third deposition sources 317a-317d (collectively 317). Each of the third deposition sources 317a-317d emit a plume of evaporated material 418a-418d (collectively 418), which is drawn to the continuous flexible substrate 110 where the patterned film of deposited material 440 is formed on the continuous flexible substrate 110. The edge shield 430 includes one or more apertures, which define a pattern of evaporated material that is deposited on the continuous flexible substrate 110. In one example, the edge shield 430 includes two apertures 432a, 432b (collectively 432). As depicted in FIG. 4, the edge shield 430 defines a patterned film of deposited material 440 on the continuous flexible substrate 110. The patterned film of deposited material 440 includes a first strip of deposited material 442a and a second strip of deposited material 442b both extending in the substrate travel direction shown by arrow 309 of the continuous flexible substrate 110. The edge shield 430 leaves an uncoated strip along a near edge 443 of the continuous flexible substrate 110, an uncoated strip along a far edge 445 of the continuous flexible substrate 110, and an uncoated strip 447 defined between the first strip of deposited material 442a and the second strip of deposited material 442b. In one example, the first aperture 432a defines the first strip of deposited material 442a and the second aperture 432b defines the second strip of deposited material 442b.

The second metrology module 380 includes a plurality of non-contact sensors 462a-462c disposed in a first module body 460. In some embodiments, as depicted in FIG. 4, the plurality of non-contact sensors 462a-462c are positioned side-by-side along the transverse direction represented by arrow 450, which is perpendicular to the travel direction represented by arrow 309. Positioning the plurality of non-contact sensors 462a-462c along the transverse direction represented by arrow 450 allows the sensors to monitor across the width of the continuous flexible substrate 110. The plurality of non-contact sensors 462a-462c can include any number of image sensors, Eddy Current Sensors (ECS), and/or thickness sensors.

FIG. 5 depicts a spectrographic metrology module 500 according to one or more embodiments described and discussed herein. The spectrographic metrology module 500 can be employed in a coating system, such as the flexible substrate coating system 300 depicted in FIG. 3 and FIG. 4. In one example, the spectrographic metrology module 500 is positioned in the location occupied by the first metrology module 370. In another example, the spectrographic metrology module 500 is positioned in the location occupied by the second metrology module 380.

The spectrographic metrology module 500 includes a sensor arrangement 505. The sensor arrangement 505 can be positioned in an atmospheric compartment 570 defined by a housing 572 as shown in FIG. 5. The housing 572 includes at least one window 510a, 510b, and 510c (collectively 510). Although three windows 510a, 510b, 510c are shown, it should be understood that more than three or less than three windows 510 can be used. The number of windows 510 typically corresponds to the number of non-contact sensors within the sensor arrangement 505. The windows 510 can be composed of any suitable material that can withstand processing chemistries within the coating system as well as allowing the optical sensors to monitor deposited materials. The atmospheric compartment 570 can be sized to fit within a coating system, for example, the flexible substrate coating system 300.

In some embodiments, the sensor arrangement 505 includes a strobe lamp 503 and different sets of optics 501a, 501b, and 501c, (collectively 501) respectively. Although three sets of optics 501a, 501b, and 501c are shown, it should be understood that more than three or less than three sets of optics could be used. Each set of optics 501 includes a lens 502, a beam splitter 504, a gathering lens 506, and a collimating lens 508. The optics 501a, 501b, 501c are positioned over different locations of the continuous flexible substrate 110, to capture separate two-dimensional images 522a, 522b, 522c, respectively. The sensor arrangement 505 further includes a spectrographic diffraction grating 512 or a prism, which function as a wavelength-dispersing element. An array 514 of light channeling elements 516 map individual image elements (pixels) of the image formed by the lens 508 to respective locations along a linear slit 520 of the spectrographic diffraction grating 512. As will be described below, the array 514 of light channeling elements 516 can be implemented in various ways, such as a bundle of fiber optic cables (in which case each light channeling element 516 is an optical fiber) or an array of micro lenses (in which case each light channeling element 516 is a micro lens). In the embodiment illustrated in FIG. 5, the array 514 maps a two-dimensional image 522 including an array of image elements 523a, 523b, 523c (collectively 523) from the continuous flexible substrate 110 into an ordered line of image elements along the linear slit 520. Each image element 523 is captured by a corresponding one of the light channeling elements 516.

In some embodiments, an imager array 530 such as a charge coupled device (CCD) array captures the spectrographic images formed by the spectrographic diffraction grating 512. A lens assembly represented as a lens assembly 532 focuses the light from the spectrographic diffraction grating 512 onto the imager array 530. The image on the imager array 530 is ordered in columns 534 of pixels 536 in accordance with a column index number "i", each column 534 being formed from the light of a respective one of the light channeling elements 516. As indicated in FIG. 5, the individual pixels 536 of each column 534 are aligned in order of increasing wavelength, A. Thus, each image element 523 in the captured two-dimensional image 522 is mapped to a column 534 of pixels 536 on the imager array 530, each column 534 constituting a spectrographic image of one image element 523. In the embodiment of FIG. 5, there are three rows of light channeling elements 516 in the array 514 (labeled ROW 1, ROW 2, and ROW 3) facing the lens 508, and the lens assembly 532 focuses the light such that the three rows are ordered in sequence from left to right across imager array 530, each image element 523 being mapped to a wavelength dispersed column on the imager array 530. The image data held in the imager array 530 is furnished to an image processor 550, which can be part of the system controller 360. The image processor 550 deduces from the data which ones of the light channeling elements 516 are aligned exclusively over a homogeneous region of interest of the continuous flexible substrate 110, and combines their outputs to produce an enhanced spectrum. A spectrum analysis processor 560, which can be part of the system controller 360, analyzes the enhanced spectrum to provide a measurement of a characteristic (e.g., film thickness) of that homogeneous region of the continuous sheet of flexible material.

As depicted in FIG. 5, the different rows of light channeling elements 516 (labeled ROW 1, ROW 2, and ROW 3) are separately coupled to different sets of optics 501a, 501b, 501c, respectively. The optics 501a, 501b, 501c are positioned over different locations of the continuous flexible substrate 110, to capture separate two-dimensional images 522a, 522b, 522c, respectively. A common strobe light 503 illuminates the optics 501a, 501b, and 501c. The embodiment of FIG. 5 can be used to make simultaneous measurements in different widely spaced zones of the continuous flexible substrate 110.

Figure 6:
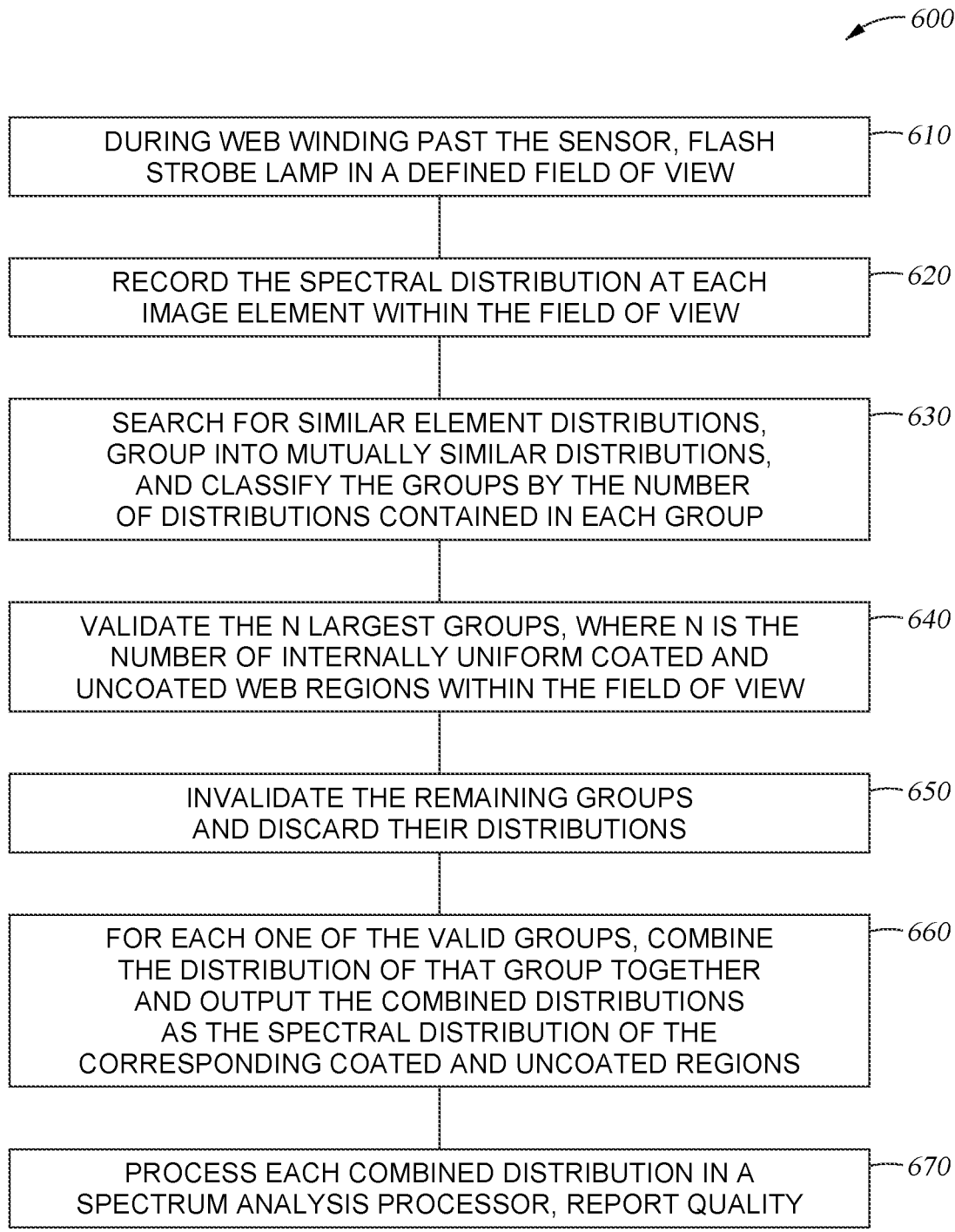
FIG. 6 illustrates a flow diagram of a process according to one or more embodiments described and discussed herein.

FIG. 6 illustrates a flow diagram of a processing sequence 600 according to one or more embodiments described and discussed herein. The processing sequence 600 can be performed using a spectrographic metrology module, for example, the spectrographic metrology module 500 depicted in FIG. 5. The spectrographic metrology module 500 can be positioned in a coating system, such as the flexible substrate coating system 300 depicted in FIG. 3 and FIG. 4.

At operation 610, during transfer of the continuous flexible substrate 110 past the sensor arrangement 505, the strobe lamp 503 is flashed once in a defined field of view. At operation 620, the resulting spectral distribution at each image element within the field of view is recorded. At operation 630, each pair of distributions is compared to determine whether they are similar. The determination of similarity can be based upon conventional calculations, such as mean square error, sum of absolute differences or sum of variances. The processor then groups the distributions into groups of mutually similar distributions. Next, the groups are classified by the number of distributions contained in each group. At operation 640, the n largest groups are validated, where n is the number of internally uniform regions of the continuous sheet of flexible material within the field of view, or a number less than that. In one example, existence of similarity between any two distributions may be inferred at operation 630 whenever the sum of the variances between them is less than a predetermined threshold. This predetermined threshold may be varied in a trial and error procedure until the number of groups, n, found at operation 630 matches the number of homogeneous regions within the field of view of the sensor. At operation 650, the processor invalidates the groups not validated at operation 630 and discards their distributions. At operation 660, for each one of the valid groups, the processor combines the distributions of that group together and outputs the combined distribution as the spectral distribution of the corresponding region of the continuous sheet of flexible material. At operation 670, the spectrum analysis processor 560 processes each combined distribution in accordance with a conventional spectrum analysis process. The quality of the deposited film can then be reported.

The spectrographic metrology module 500 can be used to detect color changes in the deposited materials. These color changes are observable after metallic lithium and protection layer coatings are applied to pre-lithiated anodes and lithium metal anodes. Thus, the color changes can be used to further facilitate precise non-contact optical-based characterization.

Figure 7:
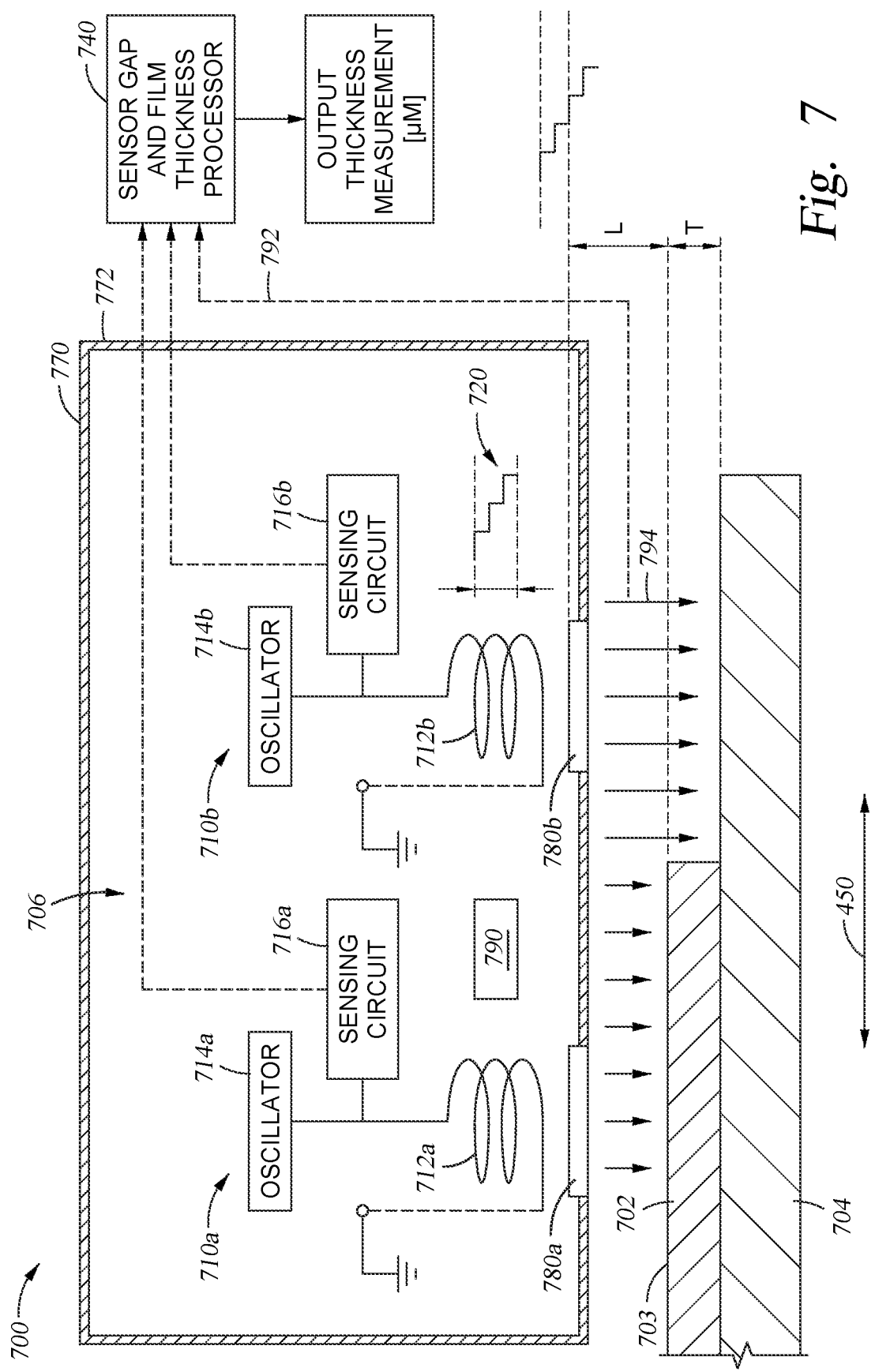
FIG. 7 illustrates an Eddy-Current sensor (ECS) metrology system according to one or more embodiments described and discussed herein.

FIG. 7 illustrates an Eddy-Current sensor (ECS) module 700 according to one or more embodiments described and discussed herein. The ECS module 700 can be employed in coating systems, such as the flexible substrate coating system 300 depicted in FIG. 3 and FIG. 4. In one example, the ECS module 700 is positioned in the location occupied by the first metrology module 370. In another example, the ECS module 700 is positioned in the location occupied by the second metrology module 380.

The ECS module 700 includes a sensor arrangement 706. The sensor arrangement 706 can be positioned in an atmospheric compartment 770 defined by a housing 772 as shown in FIG. 7. The housing 772 includes at least one window 780a, 780b (collectively 780). Although two windows 780a, 780b are shown, it should be understood that more than two or less than two windows 780 can be used. The number of windows 780 typically corresponds to the number of non-contact sensors within the sensor arrangement 706. The windows 780 can be composed of any suitable material that can withstand processing chemistries within the coating system as well as allowing the optical sensors to monitor deposited materials. The atmospheric compartment 770 can be sized to fit within a coating system, for example, the flexible substrate coating system 300.

The ECS module 700 typically operates in accordance with Faraday's law of induction and Lenz's law. The sensor arrangement 706 includes at least a pair of ECS sensors 710a, 710b (collectively 710). In some embodiments, the first ECS sensor 710a is positioned over a film material 702 formed on a substrate 704 and the second ECS sensor is positioned over the substrate 704. In one example, the film material 702 includes an anode material having a thin layer of lithium metal formed thereon. In another example, the film material 702 is a lithium metal anode. In one example, the substrate 704 is the continuous flexible substrate 110.

Each ECS sensor 710a, 710b has a coil 712a, 712b (collectively 712) and a signal oscillator 714a, 714b (collectively 714) such as alternating current (AC) signal source. The electromagnetic interaction between an AC-driven coil and a conductive object such as the film material 702 or the substrate 704, through the generation of eddy-currents inside the object, is typically influenced by multiple variables. These variables include the coil-to-sample distance, AC frequency of the coil driver signal, the coil geometry and dimensions, the electrical conductivity of the object's material, and in the case of film samples, the thickness of the film, particularly in those instances in which the thickness is less than the penetration depth of the electromagnetic field. In a typical application involving film thickness measurements, the frequency, coil geometry and dimensions, and film conductivity are usually unchanged. As a result, the variable of distance and film thickness are often the primary variables affecting the coil-sample interaction.

In some embodiments, the coil 712 and the signal oscillator 714 are controlled by a controller, for example, the system controller 360. In the illustrated embodiment of FIG. 7, the coil 712 may be driven by the signal oscillator 714 at a frequency in the range of 1 kHz to 10 MHz, for example. However, it is appreciated that particular frequency utilized may depend upon the specific application including film thickness range, material properties, lift-off distance restrictions, etc.

The coil 712, driven by the oscillating signal oscillator 714, generates an oscillating magnetic field which induces circular electrical currents inside a nearby conductive material such as the as the film material 702 or the substrate 704. The induced eddy currents in turn generate their own magnetic fields, which oppose the magnetic field generated by the coil 712. It is appreciated that the ECS module can be used with other electrically conductive films in addition to conductive metal films.

The interaction between the generated magnetic fields and the induced magnetic fields alters the complex impedance of the coil 712. The alteration of the complex impedance can be detected by a sensing circuit 716a, 716b (collectively 716) coupled to the coil 712 and controlled by the system controller 360. In this example, the sensing circuit 716 outputs a single parameter output signal "S" such as resistance loss, as a function of the altered complex impedance. It is appreciated that the ECS module 700 can have other types of single and multiple parameter sensing circuits, depending upon the particular application. The output "S" of the sensing circuit 716 can be interpreted by a processor 740 or other computational device controlled by the system controller 360, to provide a useful measurement for film material 702. The output S may be in analog or digital form. If in analog form, the processor 740 can include suitable analog to digital conversion circuitry. In some embodiments, the resistance loss signal is measured in units of millivolts. It is appreciated that other units of measurement may be utilized depending upon the particular application. The processor 740 can be part of the system controller 360.

The degree to which the complex impedance of the coil 712 is altered is typically a function of the strength of the magnetic fields induced by the eddy currents in the film material 702. In turn, the strength of the induced eddy-currents 720 is a function of the electrical conductivity of the film material 702 and the lift-off distance "L" between the coil 712 and the material of the film material 702. When the film thickness T of the film material 702 (as indicated by the arrows) is less than the penetration depth of the external magnetic field at the driving frequency of the signal oscillator 714, the induced eddy-current is also a function of the material film thickness T.

In accordance with one aspect of the present description, at least two unknown values such as lift-off distance L and the film thickness "T" of the film material 702 can be determined by comparing the signal "S" output of the sensing circuit 716 to previously obtained calibration data resulting from calibration of the ECS module 700.

The ECS module 700 can further include at least one laser profilometer 790. In the embodiment of FIG. 7, the laser profilometer 790 is positioned within the housing 772. The scan field of the laser profilometer 790 is depicted by arrows 794. In another embodiment, the laser profilometer 790 is positioned exterior to the housing 772. The laser profilometer 790 can be a LVDT profilometer thickness sensor. The laser profilometer 790 can be used to measure the lift-off distance of the web. A signal 792 from the laser profilometer 790 can be transmitted to the processor 740. The lift-off distance measured by the laser profilometer 790 can be used to correct for web flutter of the moving the continuous flexible substrate 110.

Figure 8:
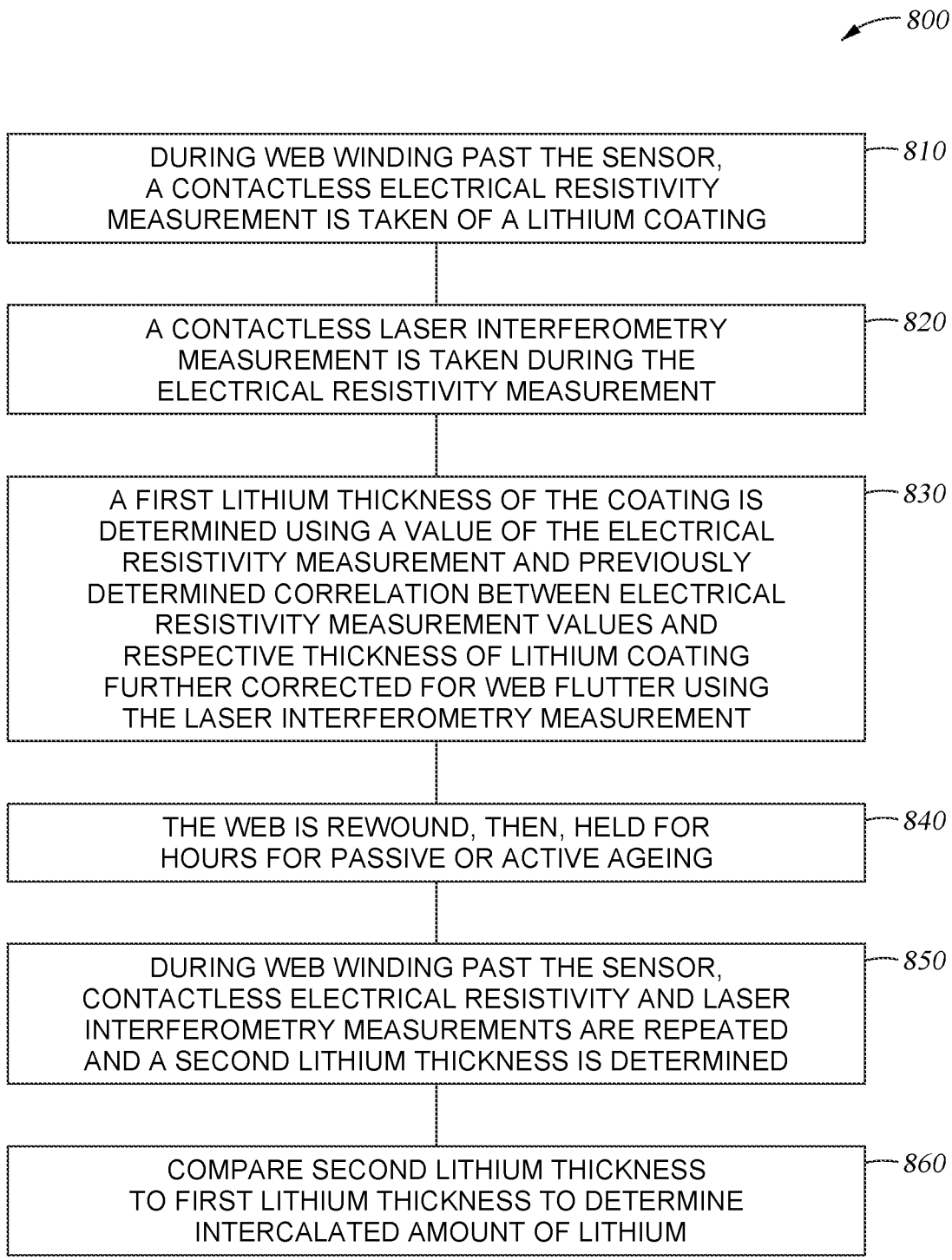
FIG. 8 illustrates a flow diagram of a process according to one or more embodiments described and discussed herein.

FIG. 8 illustrates a flow diagram of a processing sequence 800 according to one or more embodiments described and discussed herein. The processing sequence 800 can be performed using a metrology module, for example, the ECS module 700 depicted in FIG. 7. The ECS module 700 can be positioned in a coating system, such as the flexible substrate coating system 300 depicted in FIG. 3 and FIG. 4.

At operation 810, during transfer of the continuous flexible substrate 110 past the sensor arrangement 706, a contactless electrical resistivity measurement is taken of a lithium coating formed over the continuous flexible substrate 110. In one example, the lithium coating can be a lithium metal anode, for example, the first layer 120 of the flexible layer stack 100 depicted in FIG. 1. In another example, the lithium coating can be a pre-lithiation layer, for example, the first layer 120 of the flexible layer stack 200 depicted in FIG. 2. At operation 820, a contactless laser interferometry measurement is taken during the electrical resistivity measurement. The laser interferometry measurement is used to adjust the lift-off distance for both coils correcting for web flutter of the continuous flexible substrate 110. The laser interferometry measurement can be taken using the laser profilometer 790. At operation 830, a first lithium thickness of the coating is determined using a value of the electrical resistivity measurement and previously determined correlation between electrical resistivity measurement values and resistive thickness of lithium coating further corrected for web flutter using the laser interferometry measurement. At operation 840, the continuous flexible substrate 110 is rewound, then, held for passive or active ageing. At operation 850, during winding of the continuous flexible substrate 110 past the sensor, contactless electrical resistivity and laser interferometry measurements are repeated and a second lithium thickness is determined. The second lithium thickness can also be corrected for lift-off using laser interferometry measurements. At operation 860, the second lithium thickness is compared to the first lithium thickness to determine the amount of lithium intercalated into the anode.

Figure 9:
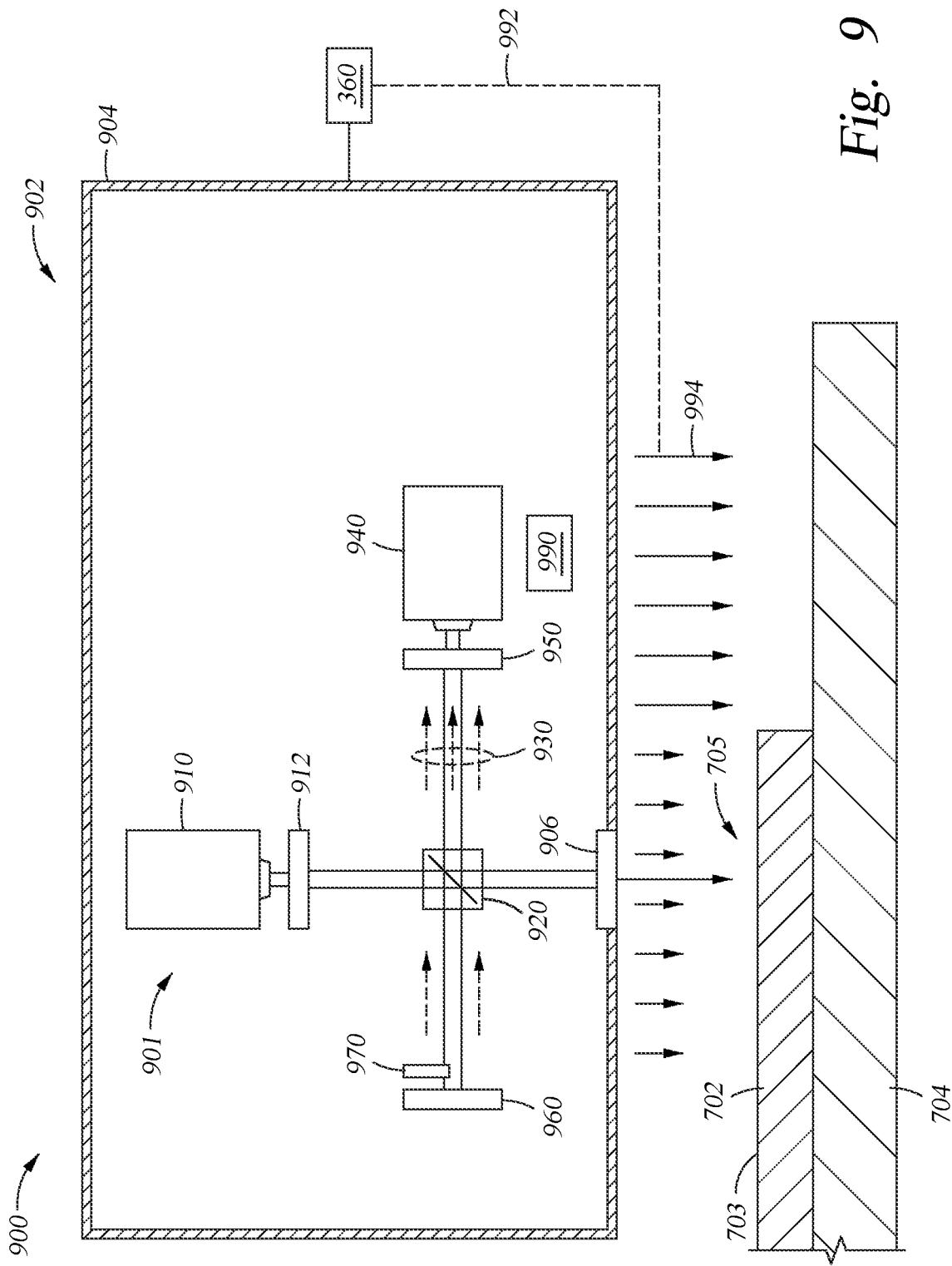
FIG. 9 illustrates a roughness sensor metrology system according to one or more embodiments described and discussed herein.

FIG. 9 illustrates a roughness metrology module 900 according to one or more embodiments described and discussed herein. The roughness metrology module 900 can be employed in coating systems, such as the flexible substrate coating system 300 depicted in FIG. 3 and FIG. 4. In one example, the roughness metrology module 900 is positioned in the location occupied by the first metrology module 370. In another example, the roughness metrology module 900 is positioned in the location occupied by the second metrology module 380.

In some embodiments, the roughness metrology module 900 is based on a Michelson interferometer design. The roughness metrology module 900 includes a sensor arrangement 901. The sensor arrangement 901 can be positioned in an atmospheric compartment 902 defined by a housing 904 as shown in FIG. 9. The housing 904 includes at least one window 906. Although one window 906 is shown, it should be understood that more than one windows 906 could be used. The number of windows 906 typically corresponds to the number of non-contact sensors within the sensor arrangement 901. The window 906 can be composed of any suitable material that can withstand processing chemistries within the coating system as well as allowing the optical sensors to monitor deposited materials. The atmospheric compartment 902 can be sized to fit within a coating system, for example, the flexible substrate coating system 300.

In some embodiments, the roughness metrology module 900 is positioned to obtain an image of the film material 702 formed on the substrate 704. In one example, the film material 702 includes an anode material having a thin layer of lithium metal formed thereon. In another example, the film material 702 is a lithium metal anode. In one example, the substrate 704 is the continuous flexible substrate 110. The sensor arrangement 901 can be focused on one or more edges 705 of the film material 702. The sensor arrangement 901 can be positioned after the metallic lithium and protection layer coating sources in the coating system.

In some embodiments, the sensor arrangement 901 includes one of more polarized structured light (PSL) sources 910, which can project narrow bands of light onto the three-dimensional edge 705, for example, a three-dimensional anode edge, of the film material 702. Coatings near the three-dimensional edge 705 typically have intrinsic nanoscale roughness, which causes the reflected polarized light to scatter and to depolarize. The scattered and depolarized light is recorded by an image sensor 940. Contrast between two reference waves and the emission from the film material 702 are used to compute a roughness that is proportional to the polarized light source. In one example, the polarized structured light source 910 is a laser source, such as, a 488-nanometer laser source.

In some embodiments, the roughness metrology module 900 includes the polarized structured light source 910 for generating an input light beam, a beam splitter 920, and the image sensor 940. In one example, the polarized structured light source 910 is an argon laser source. Other suitable light sources can be used. In one example, the image sensor 940 is a two-dimensional (2D) detector, such as a CCD or CMOS camera. Other suitable 2D detectors can be used. In some embodiments, a polarizer 912 can be positioned at the output of the polarized structured light source 910 to provide a linearly polarized beam. The roughness metrology module 900 further includes the beam splitter 920. The input light beam from the polarized structured light source 910 impinges on a rough surface, for example, a surface 703 of the film material 702 after passing through the optional polarizer 912 and the beam splitter 920. The input light beam strikes the rough surface and the scattered light changes polarization state because of the roughness of the rough surface. The beam splitter 920 reflects a portion of light coming back from the rough surface through a focusing lens 930 onto the image sensor 940. In one example, the focusing lens 930 is an achromatic lens. In some embodiments, an adjustable aperture 950 is positioned between the focusing lens 930 and the image sensor 940. The beam splitter 920 reflects another portion of the light coming back from the rough surface onto a mirror 960, for example, a plane mirror. The mirror 960 can be tilted. In some embodiments, a quarter wave plate 970 is positioned in between the mirror 960 and the beam splitter 920. Due to the positioning of the quarter wave plate 970, the electric field of the light reflected by the mirror 960 can be divided into two parts providing two plane reference waves.

The roughness metrology module 900 can further include at least one laser profilometer 990. In the embodiment of FIG. 9, the laser profilometer 990 is positioned within the housing 904. In another embodiment, the laser profilometer 990 is positioned exterior to the housing 904. The laser profilometer 990 can be a LVDT profilometer thickness sensor. The scan field of the laser profilometer 990 is depicted by arrows 994. The laser profilometer 990 can be used to measure the lift-off distance of the web. A signal 992 from the laser profilometer 990 can be transmitted to the system controller 360. The lift-off distance measured by the laser profilometer 990 can be used to correct for web flutter of the moving the continuous flexible substrate 110.

Figure 10:
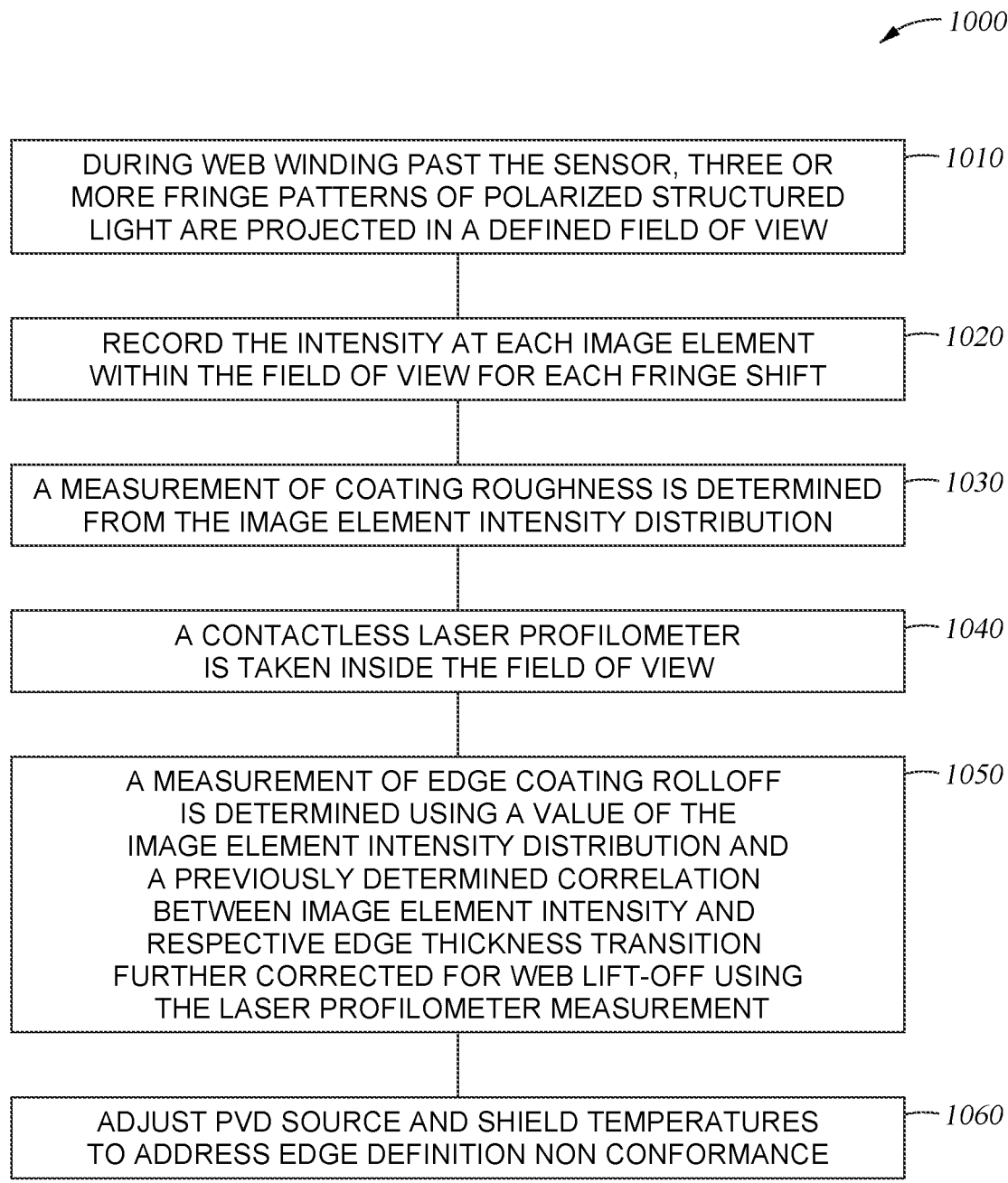
FIG. 10 illustrates a flow diagram of a process according to one or more embodiments described and discussed herein.

FIG. 10 illustrates a flow diagram of a processing sequence 1000 according to one or more embodiments described and discussed herein. The processing sequence 1000 can be performed using a roughness metrology module, for example, the roughness metrology module 900 depicted in FIG. 9. The roughness metrology module 900 can be positioned in a coating system, such as the flexible substrate coating system 300 depicted in FIG. 3 and FIG. 4.

At operation 1010, during transfer of the continuous flexible substrate 110 past the sensor arrangement 901, one or more fringe patterns, for example, three or more fringe patterns, of polarized structured light are projected in a defined field of view. At operation 1020, the intensity at each image element within the field of view is recorded for each fringe shift. At operation 1030, a measurement of coating roughness is determined from the image element intensity distribution. At operation 1040, a contactless laser interferometry measurement is taken inside the field of view. The contactless laser interferometry measurement can be taken the during roughness measurement. The laser interferometry measurement can be used to adjust the web lift-off distance. The laser interferometry measurement can be taken using the laser profilometer 990. At operation 1050, a measurement of edge coating roll-off is determined using a value of the image element intensity distribution and a previously determined correlation between the image element intensity and respective edge thickness transition further corrected for web lift-off using the laser profilometer measurement. At operation 1060, the PVD sources and shield temperatures are adjusted to address edge definition non-conformance.

Embodiments and all of the functional operations described in this specification can be implemented in digital electronic circuitry, or in computer software, firmware, or hardware, including the structural means disclosed in this specification and structural equivalents thereof, or in combinations of them. Embodiments described herein can be implemented as one or more non-transitory computer program products, for example, one or more computer programs tangibly embodied in a machine-readable storage device, for execution by, or to control the operation of, data processing apparatus, for example, a programmable processor, a computer, or multiple processors or computers.

The processes and logic flows described in this specification can be performed by one or more programmable processors executing one or more computer programs to perform functions by operating on input data and generating output. The processes and logic flows can also be performed by, and apparatus can be implemented as, special purpose logic circuitry, e.g., an FPGA (field programmable gate array) or an ASIC (application specific integrated circuit).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. Processors suitable for the execution of a computer program include, by way of example, both general and special purpose microprocessors, and any one or more processors of any kind of digital computer.

Computer readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

Embodiments described and discussed herein further relate to any one or more of the following examples 1-31:

1. A flexible substrate coating system, comprising: a processing module, comprising: a plurality of chambers arranged in sequence, each configured to perform one or more processing operations to a continuous sheet of flexible material; and a coating drum capable of guiding the continuous sheet of flexible material past the plurality of chambers along a travel direction, wherein the chambers are radially disposed about the coating drum; and a metrology module, comprising: a plurality of non-contact sensors positioned side-by-side along a transverse direction, wherein the transverse direction is perpendicular to the travel direction.

2. The flexible substrate coating system according to example 1, wherein the plurality of non-contact sensors comprise a spectrographic sensor assembly operable to capture spectrographic images of coated and uncoated portions of the continuous sheet of flexible material.

3. The flexible substrate coating system according to example 1 or 2, wherein the spectrographic sensor assembly comprises a strobe light source and an imager.

4. The flexible substrate coating system according to any one of examples 1-3, wherein the imager is a charge couple device (CCD) array.

5. The flexible substrate coating system according to any one of examples 1-4, wherein the plurality of non-contact sensors comprises a first eddy current sensor operable to measure a thickness of a coated portion of the continuous sheet of flexible material and a second eddy current sensor operable to measure a thickness of an uncoated portion of the continuous sheet of flexible material.

6. The flexible substrate coating system according to any one of examples 1-5, further comprising an optical profilometer operable to measure web flutter of the continuous sheet of flexible material.

7. The flexible substrate coating system according to any one of examples 1-6, wherein the plurality of non-contact sensors comprises a web roughness sensor operable to measure surface roughness of a coated portion of the continuous sheet of flexible material and an uncoated portion of the continuous sheet of flexible material.

8. The flexible substrate coating system according to any one of examples 1-7, wherein the web roughness sensor comprises an argon laser and a CMOS camera.

9. The flexible substrate coating system according to any one of examples 1-8, further comprising: an unwinding module housing a feed reel capable of providing the continuous sheet of flexible material; and a winding module housing a take-up reel capable of storing the continuous sheet of flexible material.

10. The flexible substrate coating system according to any one of examples 1-9, wherein the continuous sheet of flexible material comprises a copper substrate having a lithium metal layer formed on the copper substrate.

11. The flexible substrate coating system according to any one of examples 1-10, wherein the continuous sheet of flexible material comprises a copper substrate having a lithiated anode film formed on the copper substrate.

12. The flexible substrate coating system according to any one of examples 1-11, wherein the lithiated anode film comprises a graphite anode film, a silicon-graphite anode film, or a silicon film.

13. The flexible substrate coating system according to any one of examples 1-12, wherein the plurality of chambers comprises at least one of a sputtering source, a thermal evaporation source, and an electron beam source.

14. A method, comprising: transferring a continuous sheet of flexible material from a feed reel in an unwinding chamber to a deposition module arranged downstream from the unwinding chamber, the deposition module comprising a first coating drum capable of guiding the continuous sheet of flexible material past a plurality of deposition units; guiding the continuous sheet of flexible material past the plurality of deposition units along a travel direction while depositing a lithium metal film on the continuous sheet of flexible material via the plurality of deposition units, wherein the chambers are radially disposed about the coating drum; guiding the continuous sheet of flexible material past a metrology module, comprising a plurality of non-contact optical sensors positioned side-by-side along a transverse direction, wherein the optical sensors have a field of view coinciding with a travel path traversed by the continuous sheet of flexible material, and the transverse direction is perpendicular to the travel direction; flashing a strobe lamp in the field of view while guiding the continuous sheet of flexible material past the field of view; obtaining a still image of the continuous sheet of flexible material in the field of view; channeling light reflected from respective image elements of the still image through respective light channeling elements to respective locations of a spectrographic light dispenser; and recording a spectral distribution at each image element within the field of view.

15. The method according to example 14, further comprising: searching for distributions that are similar to one another and grouping the distributions into groups of mutually similar distributions; classifying the groups by a number of distributions contained in each group; selecting at least one of the largest groups and combining the distributions of that group together and providing the combined distribution as the spectral distribution of one region of the continuous sheet of flexible material; and processing the combined distribution in accordance with a spectrum analysis process.

16. The method according to example 14 or 15, wherein the continuous sheet of flexible material comprises a copper substrate and the lithium metal film is formed on the copper substrate.

17. The method according to any one of examples 14-16, wherein the continuous sheet of flexible material comprises a copper substrate having an anode film formed on the copper substrate and the lithium metal film is formed on the anode film.

18. The method according to any one of examples 14-17, wherein the anode film is selected from a graphite anode film, a silicon-graphite anode film, or a silicon film.

19. A method, comprising: transferring a continuous sheet of flexible material from a feed reel in an unwinding chamber to a deposition module arranged downstream from the unwinding chamber, the deposition module comprising a first coating drum capable of guiding the continuous sheet of flexible material past a plurality of deposition units; guiding the continuous sheet of flexible material past the plurality of deposition units along a travel direction while depositing a lithium metal film on the continuous sheet of flexible material via the plurality of deposition units, wherein the chambers are radially disposed about the coating drum; guiding the continuous sheet of flexible material past a metrology module, comprising a plurality of non-contact optical sensors positioned side-by-side along a transverse direction, wherein the optical sensors have a field of view coinciding with a travel path traversed by the continuous sheet of flexible material, and the transverse direction is perpendicular to the travel direction; and obtaining a first contactless electrical resistivity measurement of the lithium metal film on the continuous sheet of flexible material in the field of view.

20. The method according to example 19, further comprising determining a first thickness of the lithium metal film using the first contactless electrical resistivity measurement.

21. The method according to example 19 or 20, wherein determining the first thickness of the lithium metal film comprises comparing the first contactless electrical resistivity measurement with a previously determined correlation between electrical resistivity measurements and respective thickness of lithium metal films.

22. The method according to any one of examples 19-21, further comprising obtaining a contactless laser interferometry measurement of the continuous sheet of flexible material in the field of view.

23. The method according to any one of examples 19-22, further comprising determining web flutter of the continuous sheet of flexible material based on the contactless laser interferometry measurement of the continuous sheet of flexible material.

24. The method according to any one of examples 19-23, further comprising adjusting the first thickness measurement of the lithium metal film based on the web flutter to determine a corrected first thickness of the lithium metal film.

25. The method according to any one of examples 19-24, further comprising aging the lithium metal film for a period of time.

26. The method according to any one of examples 19-25, further comprising: obtaining a second contactless electrical resistivity measurement of the lithium metal film on the continuous sheet of flexible material in the field of view after aging the lithium metal film for a period of time; and determining a second thickness of the lithium metal film using the second contactless electrical resistivity measurement.

27. The method according to any one of examples 19-26, wherein determining the second thickness of the lithium metal film comprises comparing the second contactless electrical resistivity measurement with a previously determined correlation between electrical resistivity measurements and respective thickness of lithium metal films.

28. The method according to any one of examples 19-27, further comprising determining a pre-lithiation amount of an anode film deposited on the continuous sheet of flexible material by comparing the first thickness of the lithium metal film with the second thickness of the lithium metal film.

29. The method according to any one of examples 19-28, wherein the continuous sheet of flexible material comprises a copper substrate and the lithium metal film is formed on the copper substrate.

30. The method according to any one of examples 19-29, wherein the continuous sheet of flexible material comprises a copper substrate having an anode film formed on the copper substrate and the lithium metal film is formed on the anode film.

31. The method according to any one of examples 19-30, wherein the anode film is selected from a graphite anode film, a silicon-graphite anode film, or a silicon film.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" or "having" for purposes of United States law. Likewise, whenever a composition, an element, or a group of elements is preceded with the transitional phrase "comprising", it is understood that the same composition or group of elements with transitional phrases "consisting essentially of", "consisting of", "selected from the group of consisting of", or "is" preceding the recitation of the composition, element, or elements and vice versa, are contemplated. When introducing elements of the present disclosure or exemplary aspects or embodiment(s) thereof, the articles "a," "an," "the" and "said" are intended to mean that there are one or more of the elements.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

The invention claimed is:

1. A method, comprising:
   transferring a continuous sheet of flexible material from a feed reel in an unwinding chamber to a deposition module arranged downstream from the unwinding chamber, the deposition module comprising a first coating drum capable of guiding the continuous sheet of flexible material past a plurality of deposition units;
   guiding the continuous sheet of flexible material past the plurality of deposition units along a travel direction while depositing a lithium metal film on the continuous sheet of flexible material via the plurality of deposition units, wherein the chambers are radially disposed about the coating drum;
   guiding the continuous sheet of flexible material past a metrology module, comprising a plurality of non-contact optical sensors positioned side-by-side along a transverse direction, wherein the optical sensors have a field of view coinciding with a travel path traversed by the continuous sheet of flexible material, and the transverse direction is perpendicular to the travel direction; and
   obtaining a first contactless electrical resistivity measurement of the lithium metal film on the continuous sheet of flexible material in the field of view.

2. The method of claim 1, further comprising:
   determining a first thickness of the lithium metal film using the first contactless electrical resistivity measurement, wherein determining the first thickness of the lithium metal film comprises comparing the first contactless electrical resistivity measurement with a previously determined correlation between electrical resistivity measurements and respective thickness of lithium metal films;
   obtaining a contactless laser interferometry measurement of the continuous sheet of flexible material in the field of view;
   determining web flutter of the continuous sheet of flexible material based on the contactless laser interferometry measurement of the continuous sheet of flexible material;
   adjusting the first thickness measurement of the lithium metal film based on the web flutter to determine a corrected first thickness of the lithium metal film; and
   aging the lithium metal film for a period of time.

3. The method of claim 2, further comprising:
   obtaining a second contactless electrical resistivity measurement of the lithium metal film on the continuous sheet of flexible material in the field of view after aging the lithium metal film for a period of time;
   determining a second thickness of the lithium metal film using the second contactless electrical resistivity measurement, wherein determining the second thickness of the lithium metal film comprises comparing the second contactless electrical resistivity measurement with a previously determined correlation between electrical resistivity measurements and respective thickness of lithium metal films; and
   determining a pre-lithiation amount of an anode film deposited on the continuous sheet of flexible material by comparing the first thickness of the lithium metal film with the second thickness of the lithium metal film.

4. The method of claim 3, further comprising aging the lithium metal film for a period of time.

5. The method of claim 4, wherein the field of view coincides with a travel path traversed by the continuous sheet of flexible material, and the transverse direction is perpendicular to the travel direction.

6. A method, comprising:
   transferring a continuous sheet of flexible material from a feed reel in an unwinding chamber to a deposition module arranged downstream from the unwinding chamber, the deposition module comprising a first coating drum capable of guiding the continuous sheet of flexible material past a plurality of deposition units;
   guiding the continuous sheet of flexible material past the plurality of deposition units along a travel direction while depositing a lithium metal film on the continuous sheet of flexible material via the plurality of deposition units, wherein the chambers are radially disposed about the coating drum;
   guiding the continuous sheet of flexible material past a metrology module, comprising a plurality of non-contact optical sensors positioned side-by-side along a transverse direction; and
   obtaining a first contactless electrical resistivity measurement of the lithium metal film on the continuous sheet of flexible material in a field of view of the optical sensors.

7. The method of claim 6, further comprising:
   determining a first thickness of the lithium metal film using the first contactless electrical resistivity measurement, wherein determining the first thickness of the lithium metal film comprises comparing the first contactless electrical resistivity measurement with a previously determined correlation between electrical resistivity measurements and respective thickness of lithium metal films.

8. The method of claim 7, further comprising:
obtaining a contactless laser interferometry measurement of the continuous sheet of flexible material in the field of view; and
determining web flutter of the continuous sheet of flexible material based on the contactless laser interferometry measurement of the continuous sheet of flexible material.

9. The method of claim 8, further comprising adjusting the first thickness measurement of the lithium metal film based on the web flutter to determine a corrected first thickness of the lithium metal film.

10. The method of claim 9, further comprising obtaining a second contactless electrical resistivity measurement of the lithium metal film on the continuous sheet of flexible material in the field of view after aging the lithium metal film for a period of time.

11. The method of claim 10, further comprising determining a second thickness of the lithium metal film using the second contactless electrical resistivity measurement, wherein determining the second thickness of the lithium metal film comprises comparing the second contactless electrical resistivity measurement with a previously determined correlation between electrical resistivity measurements and respective thickness of lithium metal films.

12. The method of claim 11, further comprising determining a pre-lithiation amount of an anode film deposited on the continuous sheet of flexible material by comparing the first thickness of the lithium metal film with the second thickness of the lithium metal film.

* * * * *